(12) United States Patent
Binnard

(10) Patent No.: US 8,269,944 B2
(45) Date of Patent: Sep. 18, 2012

(54) APPARATUS AND METHOD FOR MAINTAINING IMMERSION FLUID IN THE GAP UNDER THE PROJECTION LENS DURING WAFER EXCHANGE IN AN IMMERSION LITHOGRAPHY MACHINE

(75) Inventor: Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/882,837

(22) Filed: Aug. 6, 2007

(65) Prior Publication Data

US 2007/0273857 A1 Nov. 29, 2007

Related U.S. Application Data

(60) Division of application No. 11/237,721, filed on Sep. 29, 2005, now Pat. No. 7,372,538, which is a continuation of application No. PCT/IB2004/001259, filed on Mar. 17, 2004.

(60) Provisional application No. 60/462,499, filed on Apr. 11, 2003.

(51) Int. Cl.
  *G03B 27/32* (2006.01)
  *G03B 27/42* (2006.01)
  *G03B 27/52* (2006.01)
  *G03B 27/58* (2006.01)

(52) U.S. Cl. ............... 355/30; 355/53; 355/72; 355/77

(58) Field of Classification Search .............. 355/30, 355/53, 72, 77, 67, 75, 492.2; 359/509, 511; 250/492.2, 30, 53, 67, 72, 75, 77
See application file for complete search history.

(56) References Cited

U.S. PATENT DOCUMENTS

| | | | |
|---|---|---|---|
| 3,648,587 | A | 3/1972 | Stevens |
| 4,026,653 | A | 5/1977 | Appelbaum et al. |
| 4,346,164 | A | 8/1982 | Tabarelli et al. |
| 4,465,368 | A | 8/1984 | Matsuura et al. |
| 4,480,910 | A | 11/1984 | Takanashi et al. |
| 4,509,852 | A | 4/1985 | Tabarelli et al. |
| 4,650,983 | A | 3/1987 | Suwa |
| 4,780,617 | A | 10/1988 | Umatate et al. |
| RE32,795 | E | 12/1988 | Matsuura et al. |
| 5,121,256 | A | 6/1992 | Corle et al. |

(Continued)

FOREIGN PATENT DOCUMENTS

DE 221 563 A1 4/1985

(Continued)

OTHER PUBLICATIONS

U.S. Appl. No. 60/462,499, filed Apr. 11, 2003.*

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

A liquid immersion exposure apparatus in which a substrate is exposed to an exposure beam, includes an optical member through which the substrate is exposed to the exposure beam, a cover member having a surface, a first holding system that detachably holds the cover member, and a second holding system that holds the cover member which is released from the first holding system. The surface of the cover member held by the second holding system is opposite to the optical member.

45 Claims, 9 Drawing Sheets

U.S. PATENT DOCUMENTS

| | | | |
|---|---|---|---|
| 5,243,195 A | 9/1993 | Nishi | |
| 5,448,332 A | 9/1995 | Sakakibara et al. | |
| 5,528,100 A | 6/1996 | Igeta et al. | |
| 5,528,118 A | 6/1996 | Lee | |
| 5,534,970 A | 7/1996 | Nakashima et al. | |
| 5,610,683 A * | 3/1997 | Takahashi | 355/53 |
| 5,611,452 A | 3/1997 | Bonora et al. | |
| 5,623,853 A | 4/1997 | Novak et al. | |
| 5,636,066 A | 6/1997 | Takahashi | |
| 5,646,413 A | 7/1997 | Nishi | |
| 5,650,840 A | 7/1997 | Taniguchi | |
| 5,668,672 A | 9/1997 | Oomura | |
| 5,677,758 A | 10/1997 | McEachern et al. | |
| 5,689,377 A | 11/1997 | Takahashi | |
| 5,691,802 A | 11/1997 | Takahashi | |
| 5,693,439 A | 12/1997 | Tanaka et al. | |
| 5,715,039 A | 2/1998 | Fukuda et al. | |
| 5,744,924 A | 4/1998 | Lee | |
| 5,805,334 A | 9/1998 | Takahashi | |
| 5,815,246 A | 9/1998 | Sperling et al. | |
| 5,825,043 A | 10/1998 | Suwa | |
| 5,835,275 A | 11/1998 | Takahashi et al. | |
| 5,844,247 A | 12/1998 | Nishi | |
| 5,861,997 A | 1/1999 | Takahashi | |
| 5,874,820 A | 2/1999 | Lee | |
| 5,900,354 A | 5/1999 | Batchelder | |
| 5,942,871 A | 8/1999 | Lee | |
| 5,964,441 A | 10/1999 | Gauger et al. | |
| 5,969,441 A | 10/1999 | Loopstra et al. | |
| 5,982,128 A | 11/1999 | Lee | |
| 5,999,333 A | 12/1999 | Takahashi | |
| 6,008,500 A | 12/1999 | Lee | |
| 6,020,710 A | 2/2000 | Lee | |
| 6,049,186 A | 4/2000 | Lee | |
| 6,051,843 A | 4/2000 | Nishi | |
| RE36,730 E | 6/2000 | Nishi | |
| 6,087,797 A | 7/2000 | Lee | |
| 6,137,561 A | 10/2000 | Imai | |
| 6,150,787 A | 11/2000 | Lee | |
| 6,151,105 A | 11/2000 | Lee | |
| 6,175,404 B1 | 1/2001 | Lee | |
| 6,188,195 B1 | 2/2001 | Lee | |
| 6,208,407 B1 | 3/2001 | Loopstra | |
| 6,246,202 B1 | 6/2001 | Lee | |
| 6,262,796 B1 | 7/2001 | Loopstra et al. | |
| RE37,309 E | 8/2001 | Nakashima et al. | |
| 6,271,640 B1 | 8/2001 | Lee | |
| 6,279,881 B1 | 8/2001 | Nishi | |
| 6,281,654 B1 | 8/2001 | Lee | |
| 6,316,901 B2 | 11/2001 | Lee | |
| 6,331,885 B1 | 12/2001 | Nishi | |
| 6,341,007 B1 | 1/2002 | Nishi | |
| 6,400,441 B1 | 6/2002 | Nishi et al. | |
| 6,417,914 B1 | 7/2002 | Li | |
| 6,426,790 B1 | 7/2002 | Hayashi | |
| 6,433,872 B1 | 8/2002 | Nishi et al. | |
| 6,445,441 B1 | 9/2002 | Mouri | |
| 6,449,030 B1 | 9/2002 | Kwan | |
| 6,496,257 B1 | 12/2002 | Taniguchi et al. | |
| 6,498,352 B1 | 12/2002 | Nishi | |
| 6,549,269 B1 | 4/2003 | Nishi et al. | |
| 6,590,634 B1 | 7/2003 | Nishi et al. | |
| 6,590,636 B2 | 7/2003 | Nishi | |
| 6,608,681 B2 | 8/2003 | Tanaka et al. | |
| 6,665,054 B2 | 12/2003 | Inoue | |
| 6,680,774 B1 * | 1/2004 | Heinle | 355/72 |
| 6,683,433 B2 | 1/2004 | Lee | |
| RE38,421 E | 2/2004 | Takahashi | |
| RE38,438 E | 2/2004 | Takahashi | |
| 6,747,732 B1 | 6/2004 | Lee | |
| 6,771,350 B2 | 8/2004 | Nishinaga | |
| 6,788,385 B2 | 9/2004 | Tanaka et al. | |
| 6,788,477 B2 | 9/2004 | Lin | |
| 6,798,491 B2 | 9/2004 | Nishi et al. | |
| 6,841,965 B2 | 1/2005 | Lee | |
| 6,842,221 B1 | 1/2005 | Shiraishi | |
| 6,853,443 B2 | 2/2005 | Nishi | |
| 6,867,844 B2 | 3/2005 | Vogel et al. | |
| 6,878,916 B2 | 4/2005 | Schuster | |
| 6,891,596 B2 | 5/2005 | Rostalski et al. | |
| 6,891,683 B2 | 5/2005 | Schuster | |
| 6,897,963 B1 | 5/2005 | Taniguchi et al. | |
| 6,906,782 B2 | 6/2005 | Nishi | |
| 6,927,836 B2 | 8/2005 | Nishinaga | |
| 6,927,840 B2 | 8/2005 | Lee | |
| 6,952,253 B2 | 10/2005 | Lof et al. | |
| 6,954,256 B2 | 10/2005 | Flagello et al. | |
| 6,989,647 B1 | 1/2006 | Lee | |
| RE39,024 E | 3/2006 | Takahashi | |
| 7,009,682 B2 | 3/2006 | Bleeker | |
| 7,038,760 B2 | 5/2006 | Mulkens et al. | |
| 7,057,702 B2 * | 6/2006 | Lof et al. | 355/30 |
| 7,075,616 B2 | 7/2006 | Derksen et al. | |
| 7,081,943 B2 | 7/2006 | Lof et al. | |
| 7,092,069 B2 | 8/2006 | Schuster | |
| 7,098,991 B2 | 8/2006 | Nagasaka et al. | |
| RE39,296 E | 9/2006 | Takahashi | |
| 7,110,081 B2 | 9/2006 | Hoogendam et al. | |
| 7,119,874 B2 | 10/2006 | Cox et al. | |
| 7,119,876 B2 | 10/2006 | Van Der Toorn et al. | |
| 7,119,881 B2 | 10/2006 | Bleeker | |
| 7,154,676 B2 | 12/2006 | Schuster | |
| 7,161,659 B2 | 1/2007 | Van Den Brink et al. | |
| 7,177,008 B2 | 2/2007 | Nishi et al. | |
| 7,190,527 B2 | 3/2007 | Rostalski et al. | |
| 7,193,232 B2 | 3/2007 | Lof et al. | |
| 7,199,858 B2 | 4/2007 | Lof et al. | |
| 7,203,008 B2 | 4/2007 | Schuster | |
| 7,213,963 B2 | 5/2007 | Lof et al. | |
| 7,224,436 B2 | 5/2007 | Derksen et al. | |
| 7,256,869 B2 | 8/2007 | Nishi | |
| 7,312,847 B2 | 12/2007 | Rostalski et al. | |
| 7,321,419 B2 | 1/2008 | Ebihara | |
| RE40,043 E | 2/2008 | Kwan et al. | |
| 7,327,435 B2 * | 2/2008 | Binnard | 355/30 |
| 7,339,743 B2 | 3/2008 | Schuster | |
| 7,352,434 B2 | 4/2008 | Streefkerk et al. | |
| 7,365,513 B1 | 4/2008 | Lee | |
| 7,372,538 B2 | 5/2008 | Binnard | |
| 7,372,541 B2 | 5/2008 | Lof et al. | |
| 7,379,158 B2 | 5/2008 | Mizutani et al. | |
| 7,382,540 B2 | 6/2008 | Rostalski et al. | |
| 7,388,648 B2 | 6/2008 | Lof et al. | |
| 7,394,521 B2 | 7/2008 | Van Santen et al. | |
| 7,399,978 B2 | 7/2008 | Van Santen et al. | |
| 7,436,486 B2 | 10/2008 | Hirukawa | |
| 7,436,487 B2 | 10/2008 | Mizutani et al. | |
| 7,442,908 B2 | 10/2008 | Schuster | |
| 7,446,851 B2 | 11/2008 | Hirukawa | |
| 7,456,929 B2 | 11/2008 | Shibuta | |
| 7,460,207 B2 | 12/2008 | Mizutani et al. | |
| 7,482,611 B2 | 1/2009 | Lof et al. | |
| 7,486,385 B2 | 2/2009 | Ebihara | |
| 7,495,840 B2 | 2/2009 | Schuster | |
| 7,505,111 B2 | 3/2009 | Hirukawa et al. | |
| 7,514,699 B2 | 4/2009 | Neijzen et al. | |
| 7,528,931 B2 | 5/2009 | Modderman | |
| 7,545,479 B2 | 6/2009 | Binnard | |
| 7,589,821 B2 | 9/2009 | Hirukawa | |
| 7,589,822 B2 | 9/2009 | Shibazaki | |
| 7,593,092 B2 | 9/2009 | Lof et al. | |
| 7,593,093 B2 | 9/2009 | Lof et al. | |
| 7,639,343 B2 | 12/2009 | Hirukawa | |
| 8,045,136 B2 | 10/2011 | Shibazaki | |
| 2001/0019250 A1 | 9/2001 | Lee | |
| 2001/0030522 A1 | 10/2001 | Lee | |
| 2002/0017889 A1 | 2/2002 | Lee | |
| 2002/0018192 A1 | 2/2002 | Nishi | |
| 2002/0020821 A1 | 2/2002 | Van Santen et al. | |
| 2002/0041377 A1 | 4/2002 | Hagiwara et al. | |
| 2002/0061469 A1 | 5/2002 | Tanaka | |
| 2002/0163629 A1 | 11/2002 | Switkes et al. | |
| 2002/0176082 A1 | 11/2002 | Sakakibara et al. | |
| 2002/0196421 A1 | 12/2002 | Tanaka et al. | |
| 2003/0025890 A1 | 2/2003 | Nishinaga | |
| 2003/0030916 A1 | 2/2003 | Suenaga | |
| 2003/0075871 A1 | 4/2003 | Shinozaki | |

| | | |
|---|---|---|
| 2003/0117596 A1 | 6/2003 | Nishi |
| 2003/0128348 A1 | 7/2003 | Nishi |
| 2003/0174408 A1 | 9/2003 | Rostalski et al. |
| 2004/0000627 A1 | 1/2004 | Schuster |
| 2004/0004757 A1 | 1/2004 | Schuster |
| 2004/0032575 A1 | 2/2004 | Nishi et al. |
| 2004/0039486 A1* | 2/2004 | Bacchi et al. ............ 700/275 |
| 2004/0075895 A1 | 4/2004 | Lin |
| 2004/0095085 A1 | 5/2004 | Lee |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0120051 A1 | 6/2004 | Schuster |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0233407 A1 | 11/2004 | Nishi et al. |
| 2004/0239904 A1 | 12/2004 | Nishinaga |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnycchenko et al. |
| 2005/0002009 A1 | 1/2005 | Lee |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0094125 A1 | 5/2005 | Arai |
| 2005/0100745 A1 | 5/2005 | Lin et al. |
| 2005/0106512 A1 | 5/2005 | Endo et al. |
| 2005/0110973 A1 | 5/2005 | Streefkerk et al. |
| 2005/0111108 A1 | 5/2005 | Schuster |
| 2005/0117134 A1 | 6/2005 | Nagasaka et al. |
| 2005/0117135 A1 | 6/2005 | Verhoeven et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0136361 A1 | 6/2005 | Endo et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175776 A1 | 8/2005 | Streefkerk et al. |
| 2005/0175940 A1 | 8/2005 | Dierichs |
| 2005/0178944 A1 | 8/2005 | Schuster |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnycchenko et al. |
| 2005/0231813 A1 | 10/2005 | Rostalski et al. |
| 2005/0231814 A1 | 10/2005 | Rostalski et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0248856 A1 | 11/2005 | Omura et al. |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0263068 A1 | 12/2005 | Hoogendam et al. |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk et al. |
| 2006/0023184 A1 | 2/2006 | Coon et al. |
| 2006/0023186 A1 | 2/2006 | Binnard |
| 2006/0023188 A1 | 2/2006 | Hara |
| 2006/0023189 A1 | 2/2006 | Lof et al. |
| 2006/0028632 A1 | 2/2006 | Hazelton et al. |
| 2006/0033899 A1 | 2/2006 | Hazelton et al. |
| 2006/0077367 A1 | 4/2006 | Kobayashi et al. |
| 2006/0082741 A1 | 4/2006 | Van Der Toorn et al. |
| 2006/0098180 A1 | 5/2006 | Bleeker |
| 2006/0103820 A1 | 5/2006 | Donders et al. |
| 2006/0114445 A1 | 6/2006 | Ebihara |
| 2006/0119820 A1 | 6/2006 | Hirukawa |
| 2006/0126037 A1 | 6/2006 | Jansen et al. |
| 2006/0126043 A1 | 6/2006 | Mizutani et al. |
| 2006/0126044 A1 | 6/2006 | Mizutani et al. |
| 2006/0132733 A1 | 6/2006 | Modderman |
| 2006/0132738 A1 | 6/2006 | Hirukawa |
| 2006/0132739 A1 | 6/2006 | Ebihara |
| 2006/0132740 A1 | 6/2006 | Ebihara |
| 2006/0152697 A1 | 7/2006 | Poon et al. |
| 2006/0158628 A1 | 7/2006 | Liebregts et al. |
| 2006/0164615 A1 | 7/2006 | Hirukawa |
| 2006/0176458 A1 | 8/2006 | Derksen et al. |
| 2006/0209414 A1 | 9/2006 | Van Santen et al. |
| 2006/0232756 A1 | 10/2006 | Lof et al. |
| 2006/0261288 A1 | 11/2006 | Van Santen |
| 2006/0268250 A1 | 11/2006 | Derksen et al. |

| | | | | | | |
|---|---|---|---|---|---|---|
| 2007/0019301 | A1 | 1/2007 | Schuster | JP | A-10-154659 | 6/1998 |
| 2007/0040133 | A1 | 2/2007 | Lof et al. | JP | A-10-163099 | 6/1998 |
| 2007/0064214 | A1 | 3/2007 | Ebihara | JP | A-10-214783 | 8/1998 |
| 2007/0109515 | A1 | 5/2007 | Nishi | JP | A-10-228661 | 8/1998 |
| 2007/0115447 | A1 | 5/2007 | Hirukawa et al. | JP | A-10-255319 | 9/1998 |
| 2007/0115448 | A1 | 5/2007 | Hirukawa et al. | JP | A-10-303114 | 11/1998 |
| 2007/0132970 | A1 | 6/2007 | Lof et al. | JP | A-10-340846 | 12/1998 |
| 2007/0132971 | A1 | 6/2007 | Sengers et al. | JP | A-11-16816 | 1/1999 |
| 2007/0132979 | A1 | 6/2007 | Lof et al. | JP | A-11-135400 | 5/1999 |
| 2007/0188880 | A1 | 8/2007 | Schuster | JP | A-11-176727 | 7/1999 |
| 2007/0211234 | A1 | 9/2007 | Ebihara | JP | A-2000-58436 | 2/2000 |
| 2007/0211235 | A1 | 9/2007 | Shibazaki | JP | A-2000-106340 | 4/2000 |
| 2007/0247722 | A1 | 10/2007 | Rostalski et al. | JP | A-2000-505958 | 5/2000 |
| 2007/0258064 | A1 | 11/2007 | Hirukawa | JP | A-2000-164504 | 6/2000 |
| 2007/0263196 | A1 | 11/2007 | Hirukawa et al. | JP | A-2000-511704 | 9/2000 |
| 2007/0268471 | A1 | 11/2007 | Lof et al. | JP | A-2001-91849 | 4/2001 |
| 2008/0002166 | A1 | 1/2008 | Ebihara | JP | A-2001-118773 | 4/2001 |
| 2008/0151203 | A1 | 6/2008 | Hirukawa et al. | JP | B-13-3203719 | 8/2001 |
| 2008/0180053 | A1 | 7/2008 | Lee | JP | A-2001-241439 | 9/2001 |
| 2008/0218717 | A1 | 9/2008 | Streefkerk et al. | JP | A-2001-313250 | 11/2001 |
| 2008/0218726 | A1 | 9/2008 | Lof et al. | JP | A-2002-14005 | 1/2002 |
| 2009/0002652 | A1 | 1/2009 | Lof et al. | JP | A-2002-134390 | 5/2002 |
| 2009/0015807 | A1 | 1/2009 | Hirukawa et al. | JP | A-2002-305140 | 10/2002 |
| 2009/0109413 | A1 | 4/2009 | Shibazaki et al. | JP | A-2003-17404 | 1/2003 |
| 2009/0184270 | A1 | 7/2009 | Lof et al. | JP | A-2003-249443 | 9/2003 |
| 2009/0190112 | A1 | 7/2009 | Ebihara | JP | A-2004-165666 | 6/2004 |
| 2009/0290135 | A1 | 11/2009 | Lof et al. | JP | A-2004-172621 | 6/2004 |
| | | | | JP | A-2004-193252 | 7/2004 |
| FOREIGN PATENT DOCUMENTS | | | | JP | A-2004-207696 | 7/2004 |
| | | | | JP | A-2004-289126 | 10/2004 |
| DE | 224 448 | A1 | 7/1985 | JP | A-2004-289128 | 10/2004 |
| EP | 0 605 103 | A1 | 7/1994 | JP | A-2004-349645 | 12/2004 |
| EP | 0 834 773 | A2 | 4/1998 | JP | A-2005-536775 | 12/2005 |
| EP | 1 041 357 | A1 | 10/2000 | JP | A-2006-509357 | 3/2006 |
| EP | 1 126 510 | A1 | 8/2001 | JP | B2-4315198 | 8/2009 |
| EP | 1 306 592 | A2 | 5/2003 | WO | WO 98/24115 | 6/1998 |
| EP | 1 420 299 | A2 | 5/2004 | WO | WO 98/28665 | 7/1998 |
| EP | 1 420 300 | A2 | 5/2004 | WO | WO 98/40791 | 9/1998 |
| EP | 1 494 267 | A1 | 1/2005 | WO | WO 98/59364 | 12/1998 |
| EP | 1 571 697 | A1 | 9/2005 | WO | WO 99/01797 | 1/1999 |
| EP | A 1 635 382 | A1 | 3/2006 | WO | WO 99/23692 | 5/1999 |
| JP | A-57-117238 | | 7/1982 | WO | WO 99/49504 A1 | 9/1999 |
| JP | A-57-153433 | | 9/1982 | WO | WO 01/84241 A1 | 11/2001 |
| JP | A-58-202448 | | 11/1983 | WO | WO 02/084720 A2 | 10/2002 |
| JP | A-59-19912 | | 2/1984 | WO | WO 02/091078 A1 | 11/2002 |
| JP | A-61-44429 | | 3/1986 | WO | WO 03/077036 A1 | 9/2003 |
| JP | A-62-65326 | | 3/1987 | WO | WO 03/077037 A1 | 9/2003 |
| JP | A-62-121417 | | 6/1987 | WO | WO 03/085708 A1 | 10/2003 |
| JP | A-63-157419 | | 6/1988 | WO | WO 2004/019128 A2 | 3/2004 |
| JP | A-2-166717 | | 6/1990 | WO | WO 2004/053955 A1 | 6/2004 |
| JP | A-4-305915 | | 10/1992 | WO | WO 2004/055803 A1 | 7/2004 |
| JP | A-4-305917 | | 10/1992 | WO | WO 2004/057589 A1 | 7/2004 |
| JP | A-5-21314 | | 1/1993 | WO | WO 2004/057590 A1 | 7/2004 |
| JP | A-5-62877 | | 3/1993 | WO | WO 2004/077154 A2 | 9/2004 |
| JP | A-05-175098 | | 7/1993 | WO | WO 2004/081666 A1 | 9/2004 |
| JP | A-5-304072 | | 11/1993 | WO | WO 2004/090577 A2 | 10/2004 |
| JP | A-06-124873 | | 5/1994 | WO | WO 2004/090633 A2 | 10/2004 |
| JP | A-6-168866 | | 6/1994 | WO | WO 2004/090634 A2 | 10/2004 |
| JP | A-6-208058 | | 7/1994 | WO | WO 2004/090956 A1 | 10/2004 |
| JP | A-6-283403 | | 10/1994 | WO | WO 2004/092830 A2 | 10/2004 |
| JP | A-6-349701 | | 12/1994 | WO | WO 2004/092833 A2 | 10/2004 |
| JP | A-7-176468 | | 7/1995 | WO | WO 2004/093130 A2 | 10/2004 |
| JP | A-7-220990 | | 8/1995 | WO | WO 2004/093159 A2 | 10/2004 |
| JP | A-7-335748 | | 12/1995 | WO | WO 2004/093160 A2 | 10/2004 |
| JP | A-8-136475 | | 5/1996 | WO | WO 2004/095135 A2 | 11/2004 |
| JP | A-08-136475 | | 5/1996 | WO | WO 2004/105107 A1 | 12/2004 |
| JP | A-8-166475 | | 6/1996 | WO | WO 2004/114380 A1 | 12/2004 |
| JP | A-08-171054 | | 7/1996 | WO | WO 2005/001432 A2 | 1/2005 |
| JP | A-8-171054 | | 7/1996 | WO | WO 2005/001572 A2 | 1/2005 |
| JP | A-8-316125 | | 11/1996 | WO | WO 2005/003864 A2 | 1/2005 |
| JP | A-8-330224 | | 12/1996 | WO | WO 2005/006026 A2 | 1/2005 |
| JP | A-08-330224 | | 12/1996 | WO | WO 2005/008339 A2 | 1/2005 |
| JP | A-08-334695 | | 12/1996 | WO | WO 2005/010611 A2 | 2/2005 |
| JP | A-8-334695 | | 12/1996 | WO | WO 2005/013008 A2 | 2/2005 |
| JP | A-9-50954 | | 2/1997 | WO | WO 2005/015283 A1 | 2/2005 |
| JP | A-9-232213 | | 9/1997 | WO | WO 2005/017625 A2 | 2/2005 |
| JP | A-10-3039 | | 1/1998 | WO | WO 2005/019935 A2 | 3/2005 |
| JP | A-10-003039 | | 1/1998 | WO | WO 2005/022266 A2 | 3/2005 |
| JP | A-10-020195 | | 1/1998 | WO | WO 2005/024325 A2 | 3/2005 |
| JP | A-10-21095 | | 1/1998 | | | |

| | | |
|---|---|---|
| WO | WO 2005/024517 A2 | 3/2005 |
| WO | WO 2005/034174 A2 | 4/2005 |
| WO | WO 2005/048328 A1 | 5/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/062351 A1 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, 3$^{rd}$ 157 nm symposium, Sep. 4, 2002, "Nikon F2 Exposure Tool", Soichi Owa et al., 25 pages (slides 1-25).
Nikon Corporation, Immersion Lithography Workshop, Dec. 11, 2002, 24 pages (slides 1-24).
Optical Microlithography XVI, Proceedings of SPIE vol. 5040 (2003), "Immersion lithography; its potential performance and issues", Soichi Owa et al., pp. 724-733.
Nikon Corporation, Immersion Workshop, Jan. 27, 2004, "Update on 193 nm immersion exposure tool", S. Owa et al., 38 pages (slides 1-38).
Nikon Corporation, Litho Forum, Jan. 28, 2004, "Update on 193 nm immersion exposure tool", S. Owa et al., 51 pages (slides 1-51).
Nikon Corporation, NGL Workshop, Jul. 10, 2003, :Potential performance and feasibility of immersion lithography, Soichi Owa et al., 33 pages, slides 1-33.
Dec. 21, 2010 Notice of Allowance in U.S. Appl. No. 11/984,980.
Jan. 5, 2011 Office Action in U.S. Appl. No. 11/812,925.
Dec. 20, 2010 Office Action in Korean Application No. 2005-7019366, with translation.
Jan. 7, 2011 Office Action in Korean Application No. 2005-7023089, with translation.
Dec. 1, 2009 Office Action in Japanese Application No. 2009-044470.
"Ductile Mode Cutting of Optical Glass Using a Flying Tool by the Action of Hydrostatic Bearing", http://martini.iis.u-tokyo.ac.jp/lab/ductile-j.html, Apr. 4, 2003, with English Translation.
Dec. 20, 2006 Office Action in U.S. Appl. No. 11/258,846.
Aug. 31, 2007 Notice of Allowance in U.S. Appl. No. 11/258,846.
Sep. 9, 2008 Office Action in U.S. Appl. No. 11/340,680.
Jun. 1, 2009 Office Action in U.S. Appl. No. 11/340,680.
Oct. 23, 2009 Office Action in U.S. Appl. No. 11/340,680.
Mar. 8, 2007 Office Action in U.S. Appl. No. 11/339,683.
Nov. 16, 2007 Office Action in U.S. Appl. No. 11/339,683.
Sep. 19, 2008 Office Action in U.S. Appl. No. 11/339,683.
May 27, 2009 Office Action in U.S. Appl. No. 11/339,683.
Nov. 6, 2009 Notice of Allowance in U.S. Appl. No. 11/339,683.
Sep. 25, 2008 Notice of Allowance in U.S. Appl. No. 11/602,371.
Dec. 3, 2008 Office Action in U.S. Appl. No. 11/785,716.
Sep. 10, 2009 Notice of Allowance in U.S. Appl. No. 11/785,716.
Jan. 15, 2010 Notice of Allowance in U.S. Appl. No. 11/785,716.
Nov. 18, 2008 Office Action in U.S. Appl. No. 11/889,733.
Aug. 28, 2009 Office Action in U.S. Appl. No. 11/889,733.
Apr. 25, 2008 Communication Pursuant to Art. 94(3) EPC in European Application No. 04 746 097.7.
Nov. 18, 2008 Communication Pursuant to Art. 94(3) EPC in European Application No. 04 746 097.7.
Sep. 7, 2007 Office Action in Chinese Application No. 200480015978 and English Translation.
Feb. 27, 2009 Chinese Office Action in Chinese Application No. 200480009702.0 with translation.
Sep. 1, 2008 Supplementary European Search Report in European Application No. 04721260.0.
Dec. 19, 2007 Indonesian Office Action in Application No. W-002005 02693 with translation.
May 10, 2009 Israeli Office Action in Israeli Application No. 170735 with translation.
Jul. 2, 2008 Search Report in Singapore Application No. 200717576-3.
Jul. 4, 2008 Search Report in Singapore Application No. 200717561-5.
Oct. 15, 2008 Search Report in Singapore Application No. 200717564-9.
Dec. 18, 2008 Invitation to Respond to Written Opinion in Singapore Application No. 200717562-3.
Jan. 27, 2009 Office Action in Japanese Application No. 2006-506525 with translation.
May 16, 2008 Chinese Office Action in Application No. 2005800002269.2 with translation.
Mar. 13, 2009 Chinese Office Action in Application No. 2005800002269.2 with translation.
European Office Action for European Application No. 05 704 182.4 dated Aug. 2, 2007.
European Office Action for European Application No. 05 704 182.4 dated Sep. 12, 2008.
Australian Office Action for Singapore Application No. 200605084-3 dated Feb. 29, 2008.
Australian Office Action for Singapore Application No. 200605084-3 dated Oct. 29, 2008.
Australian Search Report for Singapore Application No. 200605084-3 dated Jul. 10, 2008.
U.S. Office Action for U.S. Appl. No. 11/812,919 dated Sep. 9, 2009.
U.S. Office Action for U.S. Appl. No. 11/785,860 dated May 6, 2009.
U.S. Office Action for U.S. Appl. No. 11/785,860 dated Oct. 7, 2008.
U.S. Notice of Allowance for U.S. Appl. No. 11/785,860 dated Dec. 7, 2009.
U.S. Office Action for U.S. Appl. No. 10/588,029 dated Sep. 3, 2008.
U.S. Notice of Allowance for U.S. Appl. No. 10/588,029 dated May 5, 2009.
Dec. 2, 2009 Office Action for U.S. Appl. No. 11/822,804.
Mar. 1, 2011 Office Action in U.S. Appl. No. 11/812,919.
Mar. 3, 2011 Office Action in European Application No. 04721260.0.
Mar. 28, 2011 Search Report in European Application No. 10185953.6.
Mar. 28, 2011 Search Report in European Application No. 10185992.4.
Mar. 23, 2011 Office Action in Korean Application No. 2009-7023978, with translation.
Mar. 23, 2011 Office Action in Korean Application No. 2010-7000875, with translation.
Mar. 23, 2011 Office Action in Korean Application No. 2010-7023716, with translation.
Mar. 23, 2011 Office Action in Korean Application No. 2010-7023718, with translation.
Apr. 12, 2011 Office Action in Japanese Application No. 2005-517477, with translation.

May 31, 2011 Notice of Allowance in Japanese Application No. 2008-111219, with translation.
Apr. 29, 2011 Office Action in Korean Application No. 2006-7012095, with translation.
Apr. 29, 2011 Office Action in Korean Application No. 2011-7003587, with translation.
Apr. 29, 2011 Office Action in Korean Application No. 2011-7003625, with translation.
Apr. 29, 2011 Office Action in Korean Application No. 2011-7003626, with translation.
May 4, 2011 Office Action in Korean Application No. 2011-7003627, with translation.
May 4, 2011 Office Action in Korean Application No. 2011-7003628, with translation.
Apr. 23, 2010 Notice of Allowance in U.S. Appl. No. 11/340,680.
Mar. 30, 2010 Notice of Allowance in U.S. Appl. No. 11/339,683.
Mar. 10, 2010 Notice of Allowance in U.S. Appl. No. 11/785,860.
Apr. 23, 2010 Office Action in U.S. Appl. No. 11/812,919.
Jan. 28, 2010 Office Action in U.S. Appl. No. 11/889,733.
Mar. 29, 2010 Office Action in U.S. Appl. No. 11/812,925.
May 14, 2010 Notice of Allowance in U.S. Appl. No. 11/984,980.
Feb. 20, 2007 Office Action in U.S. Appl. No. 11/147,285.
Nov. 16, 2007 Office Action in U.S. Appl. No. 11/147,285.
Aug. 7, 2008 Office Action in U.S. Appl. No. 11/147,285.
Jan. 22, 2009 Office Action in U.S. Appl. No. 11/147,285.
Nov. 3, 2009 Notice of Allowance in U.S. Appl. No. 11/147,285.
Feb. 24, 2010 Notice of Allowance in U.S. Appl. No. 11/147,285.
Aug. 2, 2007 Office Action in U.S. Appl. No. 11/356,000.
Apr. 29, 2008 Office Action in U.S. Appl. No. 11/655,083.
Jan. 15, 2009 Office Action in U.S. Appl. No. 11/655,083.
Aug. 7, 2009 Notice of Allowance in U.S. Appl. No. 11/655,083.
Oct. 1, 2008 Office Action in U.S. Appl. No. 11/822,807.
Jul. 28, 2009 Office Action in U.S. Appl. No. 11/822,807.
Mar. 3, 2010 Office Action in U.S. Appl. No. 11/822,807.
Apr. 28, 2009 Office Action in U.S. Appl. No. 12/010,824.
Dec. 14, 2009 Notice of Allowance in U.S. Appl. No. 12/010,824.
Mar. 23, 2010 Notice of Allowance in U.S. Appl. No. 12/010,824.
Oct. 10, 2006 Office Action in U.S. Appl. No. 11/338,826.
Jul. 5, 2007 Office Action in U.S. Appl. No. 11/338,826.
Nov. 16, 2007 Office Action in U.S. Appl. No. 11/338,826.
Jun. 27, 2008 Notice of Allowance in U.S. Appl. No. 11/338,826.
Feb. 20, 2007 Office Action in U.S. Appl. No. 11/339,505.
Nov. 5, 2007 Office Action in U.S. Appl. No. 11/339,505.
Jun. 9, 2008 Notice of Allowance in U.S. Appl. No. 11/339,505.
Jul. 19, 2007 Office Action in U.S. Appl. No. 11/656,550.
Apr. 17, 2008 Office Action in U.S. Appl. No. 11/656,550.
Nov. 12, 2008 Notice of Allowance in U.S. Appl. No. 11/656,550.
Aug. 29, 2008 Office Action in U.S. Appl. No. 11/878,076.
May 8, 2009 Notice of Allowance in U.S. Appl. No. 11/878,076.
May 14, 2008 Office Action in U.S. Appl. No. 11/665,273.
Jul. 25, 2008 Notice of Allowance in U.S. Appl. No. 11/665,273.
Dec. 9, 2009 Notice of Allowance in Japanese Application No. 2005-507235, with translation.
Mar. 30, 2010 Notice of Allowance in Japanese Application No. 2009-044470, with translation.
Oct. 5, 2004 International Search Report and Written Opinion in Application No. PCT/JP2004/008595, with translation.
Jul. 6, 2009 Communication Under Rule 71(3) in European Application No. 04746097.7.
Sep. 26, 2008 Notice of Allowance in Chinese Application No. 200480015978.X, with translation.
Mar. 31, 2008 Australian Written Opinion and Search Report in Singapore Application No. 200605084-3.
May 17, 2005 International Search Report and Written Opinion in Application No. PCT/JP2005/001076, with translation.
Mar. 29, 2007 Search Report in European Application No. 05704182.4.
Jun. 19, 2009 Notice of Allowance in Chinese Application No. 200580002269.2, with translation.
Dec. 13, 2009 Office Action in Israeli Application No. 177221, with translation.
Apr. 28, 2009 Notice of Allowance in Japanese Application No. 2006-506525, with translation.
Mar. 1, 2005 International Search Report and Written Opinion in Application No. PCT/IB04/01259.
Aug. 4, 2009 Austrian Examination Report in Singapore Application No. 200717562-3.
Jan. 5, 2007 Austrian Examination Report in Singapore Application No. 200505829-2.
Feb. 9, 2009 Office Action in Japanese Application No. 2004-558437, with translation.
Jul. 27, 2009 Notice of Allowance in Japanese Application No. 2004-558437, with translation.
Feb. 12, 2010 Office Action in Chinese Application No. 2008101751375, with translation.
Jan. 14, 2010 Office Action in Taiwanese Application No. 09920027510, with translation.
Jun. 5, 2007 Search Report in European Application No. 03777352.0.
Apr. 17, 2009 Office Action in European Application No. 03777352.0.
Mar. 2, 2007 Office Action in Chinese Application No. 200380105467.2, with translation.
Feb. 1, 2008 Office Action in Chinese Application No. 200380105467.2, with translation.
Aug. 15, 2008 Notice of Allowance in Chinese Application No. 200380105467.2, with translation.
Dec. 10, 2007 Austrian Invitation to Respond to Written Opinion in Singapore Application No. 200503619-9.
Oct. 9, 2008 Austrian Notice of Allowance in Singapore Application No. 200503619-9.
Nov. 25, 2008 Australian Examination Report (Allowance) in Singapore Application No. 200605084-3.
Jan. 4, 2008 Supplementary European search report in European Application No. 04746097.7.
U.S. Appl. No. 12/659,894, filed Mar. 24, 2010.
Feb. 17, 2010 Office Action in U.S. Appl. No. 11/785,716.
Mar. 2, 2010 Notice of Allowance in U.S. Appl. No. 11/785,716.
Mar. 11, 2010 Supplemental Notice of Allowability in U.S. Appl. No. 11/785,716.
"Ductile Mode Cutting of Optical Glass Using a Flying Tool by the Action of Hydrostatic Bearing", http://martini.iis.u-tokyo.ac.jp/lab/ductile-j.html, Apr. 14, 2003, with English Translation.
Jun. 18, 2010 Notice of Allowance in U.S. Appl. No. 11/785,716.
Apr. 14, 2010 Office Action in Chinese Application No. 200810184648.3, with translation.
Feb. 27, 2009 Chinese Office Action in Chinese Application No. 200480009702.0 with tranlation.
Dec. 18, 2008 Invitation to Respond to Written Opinion in Singapore Application No. 2007175623.
May 16, 2008 Chinese Office Action in Application No. 200580002269.2 with translation.
Mar. 13, 2009 Chinese Office Action in Application No. 200580002269.2 with translation.
Jul. 7, 2010 Notice of Allowance in U.S. Appl. No. 11/785,860.
Aug. 3, 2010 Notice of Allowance in U.S. Appl. No. 11/147,285.
Apr. 6, 2004 International Search Report in Application No. PCT/JP03/15675, with translation.
Sep. 1, 2010 Notice of Allowance in U.S. Appl. No. 11/339,683.
Aug. 10, 2010 Communication Under Rule 71(3) EPC in European Application No. 05704182.4.
Oct. 21, 2010 Notice of Allowance in U.S. Appl. No. 11/785,716.
Oct. 13, 2010 European Search Report in European Application No. 09015888.2.
Nov. 1, 2010 Office Action in U.S. Appl. No. 11/785,539.
Sep. 9, 2010 Notice of Allowance in U.S. Appl. No. 11/340,680.
Oct. 4, 2010 Notice of Allowance in U.S. Appl. No. 11/785,860.
Oct. 7, 2010 Notice of Allowance in U.S. Appl. No. 11/984,980.
Feb. 4, 2010 Office Action in U.S. Appl. No. 11/785,539.
Oct. 26, 2011 Office Action issued in U.S. Appl. No. 11/785,539.
Oct. 21, 2011 Office Action issued in U.S. Appl. No. 11/889,733.
Oct. 14, 2011 Office Action issued in U.S. Appl. No. 12/382,807.
Jan. 24, 2012 Office Action issue in EP Application No. 10 185 953.6.
Mar. 6, 2012 Office Action issued in U.S. Appl. No. 12/461,244.
Sep. 1, 2011 Office Action issued in U.S. Appl. No. 11/812,919.
Sep. 1, 2011 Office Action issued in U.S. Appl. No. 11/812,925.
Sep. 6, 2011 Office Action issued in U.S. Appl. No. 12/659,894.

Sep. 29, 2011 Office Action issued in U.S. Appl. No. 12/453,386.
Jan. 17, 2012 Office Action issued in U.S. Appl. No. 12/461,246.
Dec. 9, 2011 Office Action issued in U.S. Appl. No. 11/822,807.
Jun. 14, 2012 Office Action issued in U.S. Appl. No. 12/659,894.
Jun. 14, 2012 Office Action issued in U.S. Appl. No. 11/812,925.
Jun. 15, 2012 Office Action issued in U.S. Appl. No. 11/812,919.
Jun. 15, 2012 Office Action issued in U.S. Appl. No. 12/923,823.
Jun. 20, 2012 Office Action issued in U.S. Appl. No. 11/785,539.
Jun. 21, 2012 Office Action issued in U.S. Appl. No. 12/453,386.
Jul. 12, 2012 Office Action issued in U.S. Appl. No. 12/923,718.
Jun. 19, 2012 Office Action issued in Korean Application No. 2012-7006824 (with English translation).
May 7, 2012 Office Action issued in U.S. Appl. No. 11/889,733.

* cited by examiner

APPARATUS AND METHOD FOR MAINTAINING IMMERSION FLUID IN THE GAP UNDER THE PROJECTION LENS DURING WAFER EXCHANGE IN AN IMMERSION LITHOGRAPHY MACHINE

RELATED APPLICATIONS

This is a Divisional of U.S. patent application Ser. No. 11/237,721 filed Sep. 29, 2005, which is a Continuation of International Application No. PCT/IB2004/001259 filed Mar. 17, 2004, which claims the benefit of U.S. Provisional Application No. 60/462,499 filed on Apr. 11, 2003. The entire disclosures of the prior applications are incorporated herein by reference in their entireties.

BACKGROUND

Lithography systems are commonly used to transfer images from a reticle onto a semiconductor wafer during semiconductor processing. A typical lithography system includes an optical assembly, a reticle stage for holding a reticle defining a pattern, a wafer stage assembly that positions a semiconductor wafer, and a measurement system that precisely monitors the position of the reticle and the wafer. During operation, an image defined by the reticle is projected by the optical assembly onto the wafer. The projected image is typically the size of one or more die on the wafer. After an exposure, the wafer stage assembly moves the wafer and then another exposure takes place. This process is repeated until all the die on the wafer are exposed. The wafer is then removed and a new wafer is exchanged in its place.

Immersion lithography systems utilize a layer of immersion fluid that completely fills a gap between the optical assembly and the wafer during the exposure of the wafer. The optic properties of the immersion fluid, along with the optical assembly, allow the projection of smaller feature sizes than is currently possible using standard optical lithography. For example, immersion lithography is currently being considered for next generation semiconductor technologies including 65 nanometers, 45 nanometers, and beyond. Immersion lithography therefore represents a significant technological breakthrough that will likely enable the continued use of optical lithography for the foreseeable future.

After a wafer is exposed, it is removed and exchanged with a new wafer. As currently contemplated in immersion systems, the immersion fluid would be removed from the gap and then replenished after the wafer is exchanged. More specifically, when a wafer is to be exchanged, the fluid supply to the gap is turned off, the fluid is removed from the gap (i.e., by vacuum), the old wafer is removed, a new wafer is aligned and placed under the optical assembly, and then the gap is re-filled with fresh immersion fluid. Once all of the above steps are complete, exposure of the new wafer can begin.

Wafer exchange with immersion lithography as described above is problematic for a number of reasons. The repeated filling and draining of the gap may cause variations in the immersion fluid and may cause bubbles to form within the immersion fluid. Bubbles and the unsteady fluid may interfere with the projection of the image on the reticle onto the wafer, thereby reducing yields. The overall process also involves many steps and is time consuming, which reduces the overall throughput of the machine.

An apparatus and method for maintaining immersion fluid in the gap adjacent to the projection lens when the wafer stage moves away from the projection lens, for example during wafer exchange, is therefore needed.

SUMMARY

An apparatus and method maintain immersion fluid in the gap adjacent to the projection lens in a lithography machine. The apparatus and method include an optical assembly that projects an image onto a work piece and a stage assembly including a work piece table that supports the work piece adjacent to the optical assembly. An environmental system is provided to supply and remove an immersion fluid from the gap. After exposure of the work piece is complete, an exchange system removes the work piece and replaces it with a second work piece. An immersion fluid containment system is provided to maintain the immersion fluid in the gap when the work piece table moves away from the projection lens. The gap therefore does not have to be refilled with immersion fluid when the first work piece is replaced with a second work piece.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
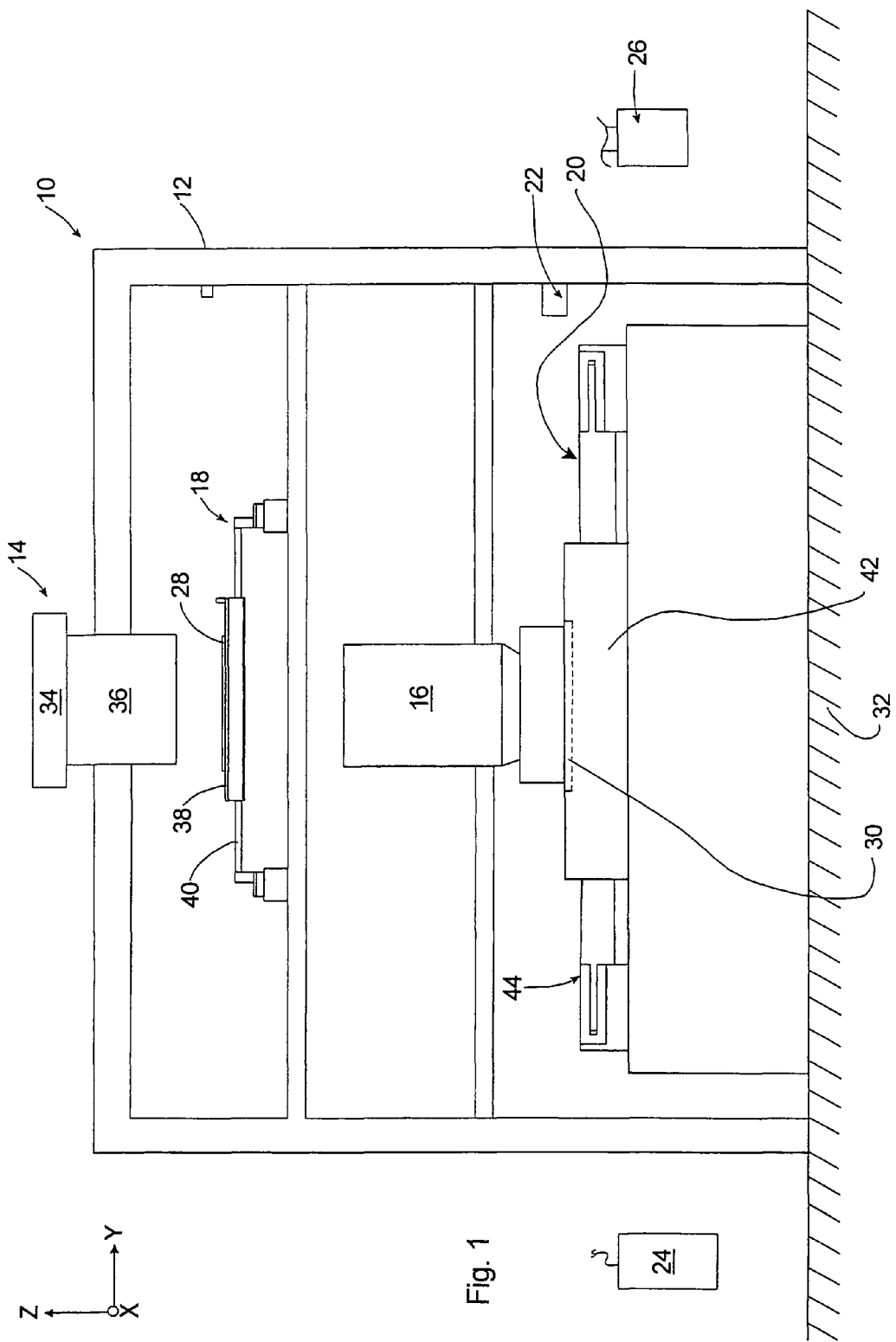
FIG. 1 is an illustration of an immersion lithography machine having features of the invention.

FIG. 1 is a schematic illustration of a lithography machine 10 having features of the invention. The lithography machine 10 includes a frame 12, an illumination system 14 (irradiation apparatus), an optical assembly 16, a reticle stage assembly 18, a work piece stage assembly 20, a measurement system 22, a control system 24, and a fluid environmental system 26. The design of the components of the lithography machine 10 can be varied to suit the design requirements of the lithography machine 10.

In one embodiment, the lithography machine 10 is used to transfer a pattern (not shown) of an integrated circuit from a reticle 28 onto a semiconductor wafer 30 (illustrated in phantom). The lithography machine 10 mounts to a mounting base 32, e.g., the ground, a base, or floor or some other supporting structure.

In various embodiments of the invention, the lithography machine 10 can be used as a scanning type photolithography system that exposes the pattern from the reticle 28 onto the wafer 30 with the reticle 28 and the wafer 30 moving synchronously. In a scanning type lithographic machine, the reticle 28 is moved perpendicularly to an optical axis of the optical assembly 16 by the reticle stage assembly 18, and the wafer 30 is moved perpendicularly to the optical axis of the optical assembly 16 by the wafer stage assembly 20. Scanning of the reticle 28 and the wafer 30 occurs while the reticle 28 and the wafer 30 are moving synchronously.

Alternatively, the lithography machine 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 20 perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the lithography machine 10 provided herein is not necessarily limited to a photolithography for semiconductor manufacturing. The lithography machine 10, for example, can be used as an LCD photolithography system that exposes a liquid crystal display work piece pattern onto a rectangular glass plate or a photolithography system for manufacturing a thin film magnetic head. Accordingly, the term "work piece" is generically used herein to refer to any device that may be patterned using lithography, such as but not limited to wafers or LCD substrates.

The apparatus frame 12 supports the components of the lithography machine 10. The apparatus frame 12 illustrated in FIG. 1 supports the reticle stage assembly 18, the wafer stage assembly 20, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 28 and exposes the wafer 30. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate an x-ray.

The optical assembly 16 projects and/or focuses the light passing through the reticle 28 to the wafer 30. Depending upon the design of the lithography machine 10, the optical assembly 16 can magnify or reduce the image illuminated on the reticle 28. The optical assembly 16 need not be limited to a reduction system. It could also be a 1× or greater magnification system.

Also, with an exposure work piece that employs vacuum ultra-violet radiation (VUV) of wavelength 200 nm or lower, use of a catadioptric type optical system can be considered. Examples of a catadioptric type of optical system are disclosed in Japanese Laid-Open Patent Application Publication No. 8-171054 and its counterpart U.S. Pat. No. 5,668,672, as well as Japanese Laid-Open Patent Publication No. 10-20195 and its counterpart U.S. Pat. No. 5,835,275. In these cases, the reflecting optical system can be a catadioptric optical system incorporating a beam splitter and concave mirror. Japanese Laid-Open Patent Application Publication No. 8-334695 and its counterpart U.S. Pat. No. 5,689,377 as well as Japanese Laid-Open Patent Application Publication No. 10-3039 and its counterpart U.S. patent application No. 873,605 (Application Date: Jun. 12, 1997) also use a reflecting-refracting type of optical system incorporating a concave mirror, etc., but without a beam splitter, and also can be employed with this invention. The disclosures of the above-mentioned U.S. patents and applications, as well as the Japanese Laid-Open patent application publications are incorporated herein by reference in their entireties.

The reticle stage assembly 18 holds and positions the reticle 28 relative to the optical assembly 16 and the wafer 30. In one embodiment, the reticle stage assembly 18 includes a reticle stage 38 that retains the reticle 28 and a reticle stage mover assembly 40 that moves and positions the reticle stage 38 and reticle 28.

Each stage mover assembly 40, 44 can move the respective stage 38, 42 with three degrees of freedom, less than three degrees of freedom, or more than three degrees of freedom. For example, in alternative embodiments, each stage mover assembly 40, 44 can move the respective stage 38, 42 with one, two, three, four, five or six degrees of freedom. The reticle stage mover assembly 40 and the work piece stage mover assembly 44 can each include one or more movers, such as rotary motors, voice coil motors, linear motors utilizing a Lorentz force to generate drive force, electromagnetic movers, planar motors, or some other force movers.

In photolithography systems, when linear motors (see U.S. Pat. Nos. 5,623,853 or 5,528,118 which are incorporated by reference herein in their entireties) are used in the wafer stage assembly or the reticle stage assembly, the linear motors can be either an air levitation type employing air bearings or a magnetic levitation type using Lorentz force or reactance force. Additionally, the stage could move along a guide, or it could be a guideless type stage that uses no guide.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and Japanese Laid-Open Patent Application Publication No. 8-136475. Additionally, reaction forces generated by the reticle (mask) stage motion can be mechanically transferred to the floor (ground) by use of a frame member as described in U.S. Pat. No. 5,874,820 and Japanese Laid-Open Patent Application Publication No. 8-330224. The disclosures of U.S. Pat. Nos. 5,528,100 and 5,874,820 and Japanese Paid-Open Patent Application Publication Nos. 8-136475 and 8-330224 are incorporated herein by reference in their entireties.

The measurement system 22 monitors movement of the reticle 28 and the wafer 30 relative to the optical assembly 16 or some other reference. With this information, the control system 24 can control the reticle stage assembly 18 to precisely position the reticle 28 and the work piece stage assembly 20 to precisely position the wafer 30. The design of the measurement system 22 can vary. For example, the measurement system 22 can utilize multiple laser interferometers, encoders, mirrors, and/or other measuring devices.

The control system 24 receives information from the measurement system 22 and controls the stage assemblies 18, 20 to precisely position the reticle 28 and the wafer 30. Additionally, the control system 24 can control the operation of the components of the environmental system 26. The control system 24 can include one or more processors and circuits.

The environmental system 26 controls the environment in a gap (not shown) between the optical assembly 16 and the wafer 30. The gap includes an imaging field. The imaging field includes the area adjacent to the region of the wafer 30 that is being exposed and the area in which the beam of light energy travels between the optical assembly 16 and the wafer 30. With this design, the environmental system 26 can control the environment in the imaging field. The desired environment created and/or controlled in the gap by the environmental system 26 can vary accordingly to the wafer 30 and the design of the rest of the components of the lithography machine 10, including the illumination system 14. For example, the desired controlled environment can be a fluid such as water. Alternatively, the desired controlled environment can be another type of fluid such as a gas. In various embodiments, the gap may range from 0.1 mm to 10 mm in height between top surface of the wafer 30 and the last optical element of the optical assembly 16.

In one embodiment, the environmental system 26 fills the imaging field and the rest of the gap with an immersion fluid. The design of the environmental system 26 and the components of the environmental system 26 can be varied. In different embodiments, the environmental system 26 delivers and/or injects immersion fluid into the gap using spray nozzles, electro-kinetic sponges, porous materials, etc. and removes the fluid from the gap using vacuum pumps, sponges, and the like. The design of the environmental system 26 can vary. For example, it can inject the immersion fluid at one or more locations at or near the gap. Further, the immersion fluid system can assist in removing and/or scavenging the immersion fluid at one or more locations at or near the work piece 30, the gap and/or the edge of the optical assembly 16. For additional details on various environmental systems, see U.S. provisional patent applications 60/462,142 entitled "Immersion Lithography Fluid Control System" filed on Apr. 9, 2003, 60/462,112 entitled "Vacuum Ring System and Wick Ring System for Immersion Lithography" filed on Apr. 10, 2003, 60/500,312 entitled "Noiseless Fluid Recovery With Porous Material" filed on Sep. 3, 2003, and 60/541,329 entitled "Nozzle Design for Immersion Lithography" filed on Feb. 2, 2004, all incorporated by reference herein in their entireties.

Figure 2:
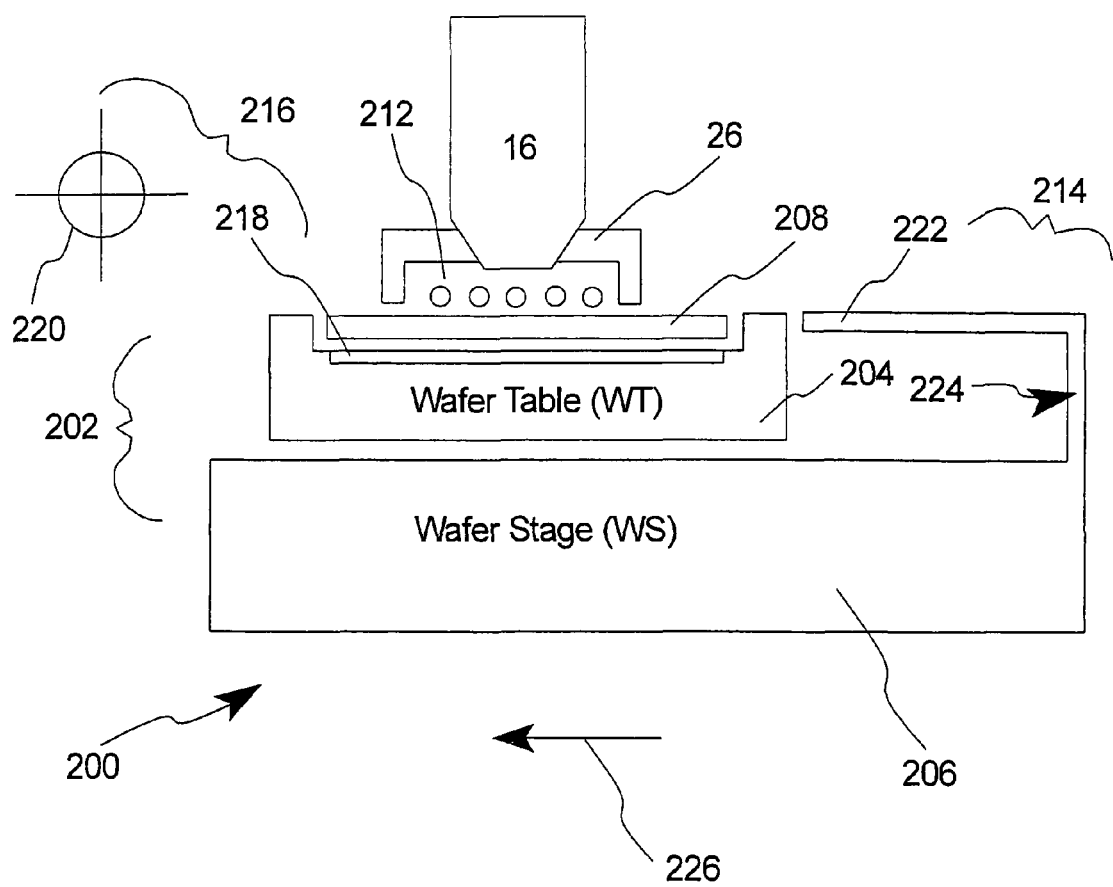
FIG. 2 is a cross section of an immersion lithography machine according to one embodiment of the invention.

Referring to FIG. 2, a cross section of a lithography machine illustrating one embodiment of the invention is shown. The lithography machine 200 includes a optical assembly 16 and a stage assembly 202 that includes a wafer table 204 and a wafer stage 206. The wafer table 204 is configured to support a wafer 208 (or any other type of work piece) under the optical assembly 16. An environmental system 26, surrounding the optical assembly 16, is used to supply and remove immersion fluid 212 from the gap between the wafer 208 and the last optical element of the optical assembly 16. A work piece exchange system 216, including a wafer loader 218 (i.e., a robot) and an alignment tool 220 (i.e., a microscope and CCD camera), is configured to remove the wafer 208 on the wafer table 204 and replace it with a second wafer. This is typically accomplished using the wafer loader 218 to lift and remove the wafer 208 from the wafer table 204. Subsequently, the second wafer (not shown) is placed onto the wafer chuck 218, aligned using the alignment tool 220, and then positioned under the optical assembly 16 on the wafer table 204.

With this embodiment, the wafer stage 206 includes an immersion fluid containment system 214 that is configured to maintain the immersion fluid 212 in the gap adjacent to the last optical element of the optical assembly 16 during wafer exchange. The immersion fluid containment system 214 includes a pad 222 that is adjacent to the wafer table 204. A support member 224, provided between the pad 222 and the wafer stage 206, is used to support the pad 222. The wafer table 204 has a flat upper surface that is coplanar with a surface of the wafer 208. The pad 222 also has a flat upper surface that is coplanar with the upper surface of the wafer table 204 and the wafer surface. The pad 222 is arranged adjacent to the wafer table 204 with a very small gap (e.g., 0.1-1.0 mm) so that the immersion fluid 212 is movable between the wafer table 204 and the pad 222 without leaking. During a wafer exchange, the wafer stage 206 is moved in the direction of arrow 226 so that the pad 222 is positioned under the optical assembly 16 in place of the wafer table 204, maintaining the fluid in the gap or maintaining the size of the fluid gap. After the new wafer has been aligned, the wafer stage is moved back to its original position so that the pad 222 is removed from the gap as the second wafer is positioned under the optical assembly 16. In various embodiments, the pad 222 is disposed continuously adjacent to the wafer table 204 with no gap. Vertical position and/or tilt of the wafer table 204 can be adjusted so that the wafer table surface is coplanar with the pad surface, before the wafer table 204 is moved out from under the optical assembly 16. Maintaining the gap between the pad 222 and the optical assembly 16 is not limited to just a wafer exchange operation. The pad 222 can be large enough to maintain the immersion fluid 212 in the space between the pad 222 and the optical assembly 16 during an alignment operation or a measurement operation. In those operations, a part of the area occupied by the immersion fluid 212 may be on the upper surface of the wafer table 204.

Figure 3A:
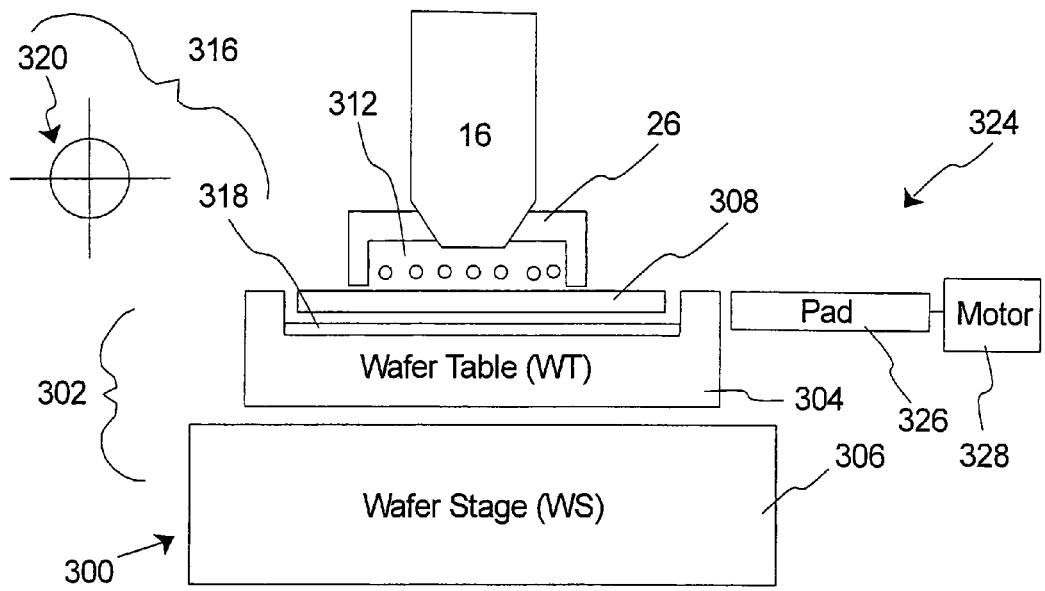
FIGS. 3A and 3B are a cross section and a top down view of an immersion lithography machine according to another embodiment of the invention.
Figure 3B:
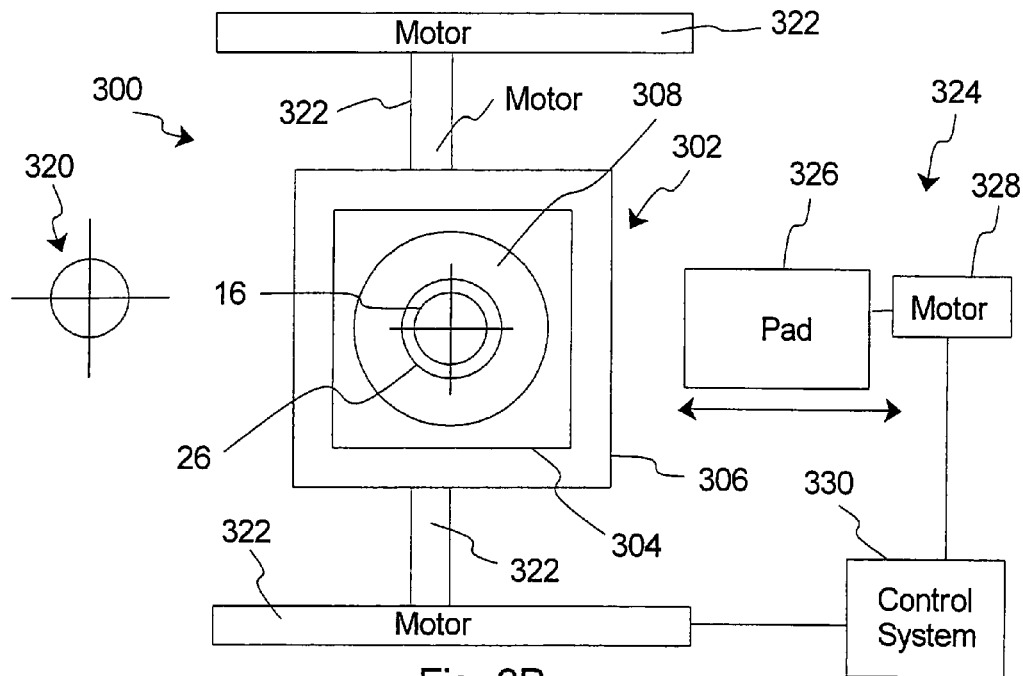

Referring to FIGS. 3A and 3B, a cross section and a top down view of another immersion lithography machine according to another embodiment of the present invention are shown. The lithography machine 300 includes an optical assembly 16 and a stage assembly 302 that includes a wafer table 304 and a wafer stage 306. The wafer table 304 is configured to support a wafer 308 (or any other type of work piece) under the optical assembly 16. An environmental system 26, surrounding the optical assembly 16, is used to supply and remove immersion fluid 312 from the gap between the wafer 308 and the lower most optical element of the optical assembly 16. A work piece exchange system 316, including a wafer loader 318 and an alignment tool 320, is configured to remove the wafer 308 on the wafer table 304 and replace it with a second wafer. This is accomplished using the wafer loader 318 to remove the wafer 308 from the wafer table. Subsequently, the second wafer (not shown) is placed onto the wafer chuck 318, aligned using the alignment tool 320, and then positioned under the optical assembly 16. As best illustrated in FIG. 3B, a set of motors 322 are used to move the wafer assembly 302 including the wafer table 304 and wafer stage 306 in two degrees of freedom (X and Y) during operation. As noted above, the motors 322 can be any type of motors, such as linear motors, rotary motors, voice coil motors, etc.

The immersion lithography machine 300 also includes an immersion fluid containment system 324 that is configured to maintain the immersion fluid 312 in the space below the optical assembly 16 while the wafer table 304 is away from under the optical assembly. The immersion fluid containment system 324 includes a pad 326, a motor 328, and a control system 330. The pad 326 can be positioned adjacent to the optical assembly 16 and the wafer table 304. The wafer table 304 has a flat upper surface that is coplanar with a surface of the wafer 308. The pad 326 has a flat upper surface that is coplanar with the upper surface of the wafer table 304 and the wafer surface. The pad 326 is movable in the X and Y directions using the motor 328, which is controlled by the control system 330. The motor 328 can be any type of motor as well as the motors 322. The pad 326 is positioned under the optical assembly 16 when the wafer table 304 (the wafer stage 306) is away from under the optical assembly 16. During a wafer exchange, the wafer table 304 moves away from the optical assembly 16. Simultaneously, the control system 330 directs the motor 328 to move pad 326 under the optical assembly 16, replacing the wafer table 304. The pad 326 thus retains the immersion fluid 312 within the gap under the optical assembly 16. After the new wafer has been aligned using the alignment tool 320, the wafer table 304 is repositioned under the optical assembly 16. At the same time, the control system 330 directs the motor 328 to retract the pad 326 from the gap, preventing the escape of the immersion fluid 312. In the wafer exchange operation, the control system 330 moves the wafer table 304 and the pad 326 with a small gap between the wafer table 304 and the pad 326, while the immersion fluid 312 below the optical assembly 16 moves between the wafer table 304 and the pad 326. The immersion fluid containment system 324 thus maintains the immersion fluid 312 from the gap during wafer exchange. In this embodiment, the wafer table 304 (the wafer stage 306) and the pad 326 are movable separately. Therefore, the wafer table 304 is movable freely while the immersion fluid 312 is maintained in the space between the pad 326 and the optical assembly 16. In various embodiments of the invention, the control system 330 may be a separate control system or it can be integrated into the control system used to control the motors 322 for positioning the wafer stage 306 and wafer table 304. Vertical position and/or tilt of at least one of the wafer table 304 and the pad 326 may be adjusted so that the wafer table surface is coplanar with the pad surface, before the wafer table is moved out from under the optical assembly 16. The operation, in which the wafer table 304 is away from the optical assembly 16, is not necessarily limited to a wafer exchange operation. For example, an alignment operation, a measurement operation or other operation may be executed while maintaining the immersion fluid 312 in the space between the pad 326 and the optical assembly 16.

Figure 4A:
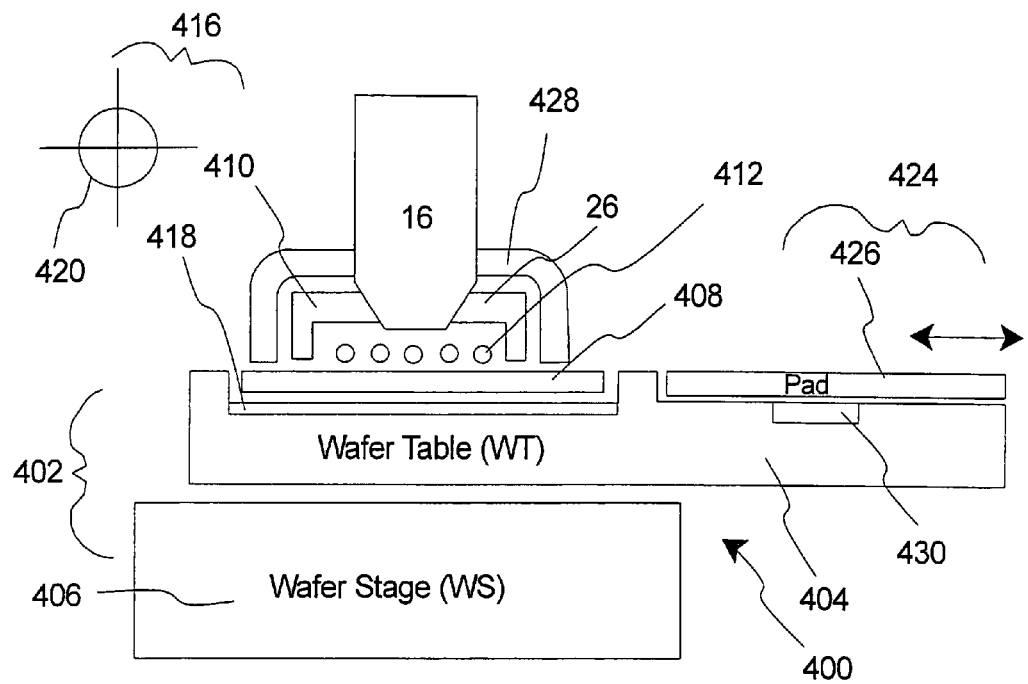
FIGS. 4A and 4B are cross section views of an immersion lithography machine according to another embodiment of the invention.
Figure 4B:
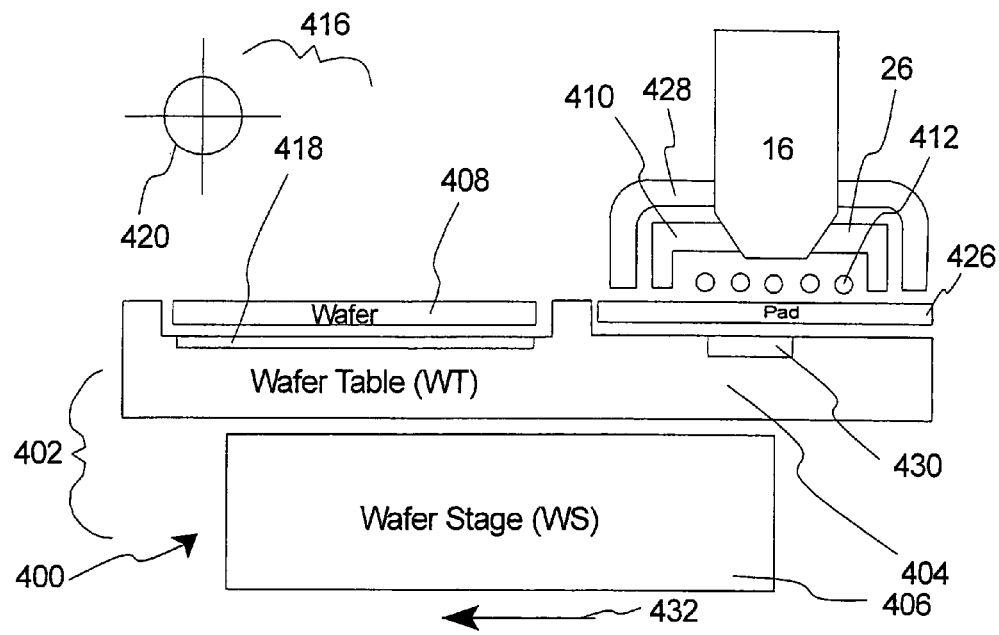

Referring to FIGS. 4A and 4B, two cross sections of an immersion lithography machine are shown. The lithography machine 400 includes an optical assembly 16 and a stage assembly 402 that includes a wafer table 404 and a wafer stage 406. The wafer table 404 is configured to support a wafer 408 (or any other type of work piece) under the optical assembly 16. An environmental system 26 (410), surrounding the optical assembly 16, is used to supply and remove immersion fluid 412 from the gap between the wafer 408 and the lower most optical element of the optical assembly 16. A work piece exchange system 416, including a wafer loader 418 and an alignment tool 420, is configured to remove the wafer 408 on the wafer table 404 and replace it with a second wafer. This is accomplished using the wafer loader 418 to remove the wafer 408 from the wafer table 404. Subsequently, the second wafer (not shown) is placed onto the wafer chuck 418, aligned using the alignment tool 420, and then positioned under the optical assembly 16 as illustrated in the FIG. 4A.

The immersion lithography machine 400 also includes an immersion fluid containment system 424 that is configured to maintain the immersion fluid 412 in the space below the optical assembly 16 while the wafer table 404 is away from under the optical assembly 16. The immersion fluid containment system 424 includes a pad 426, a first clamp 428 provided on the optical assembly 16 and a second clamp 430 provided on the wafer table 404. When the immersion fluid 412 is between the optical assembly 16 and the wafer table 404 (or the wafer 408), the pad 426 is held by the second clamp 430 in place on the wafer table 404. When the wafer table 404 is away from the optical assembly 16, for example during a wafer exchange operation, the pad 426 is detached from the wafer table 404 and held by the first clamp 428 to maintain the immersion fluid 412 between the optical assembly 16 and the pad 426. The wafer table 404 has a flat upper surface that is coplanar with a surface of the wafer 408. The pad 426 held on the wafer table 404 also has a flat upper surface that is coplanar with the upper surface of the wafer table 404 and the wafer surface. Therefore, the immersion pad 426 and wafer 408 can be moved under the optical assembly without the immersion fluid leaking. In various embodiments, the clamps 428 and 430 can be vacuum clamps, magnetic, electrostatic, or mechanical.

As best illustrated in FIG. 4A, the pad 426 is positioned on the wafer table 404 during exposure of the wafer 408. The second clamp 430 is used to hold the pad 426 in place on the table 404 during the wafer exposure. During a wafer exchange as illustrated in FIG. 4B, the wafer table 404 is moved in the direction of arrow 432 so that the pad 426 is positioned under the optical assembly 16 in place of the wafer 408. When this occurs, the second clamp 430 holding the pad 426 to the wafer table 404 is released while first clamp 428 clamps the pad 426 to the optical assembly 16. As a result, the immersion fluid 412 is maintained under the optical assembly while the wafer 408 is exchanged. After the new wafer has been aligned, the wafer table 404 is moved in the direction opposite arrow 432 so that the new wafer is positioned under the optical assembly. Prior to this motion, the first clamp 428 is released while the second clamp 430 again clamps the pad 426 to the wafer table 404. In this embodiment, the wafer table 404 is freely movable while the pad 426 is clamped by the first clamp 428.

In various embodiments, the operation, in which the pad 426 is clamped by the first clamp 428, is not limited to only a wafer exchange operation. An alignment operation, a measurement operation, or any other operation can be executed while the immersion fluid 412 is maintained in the space between the optical assembly 16 and the pad 426 clamped by the first clamp 428. Also, the clamp 428 can be provided on the frame 12 or other support member, and the clamp 430 can be provided on the wafer stage 406. The pad 426 can be held on a movable member other than the stage assembly 402.

Figure 5A:
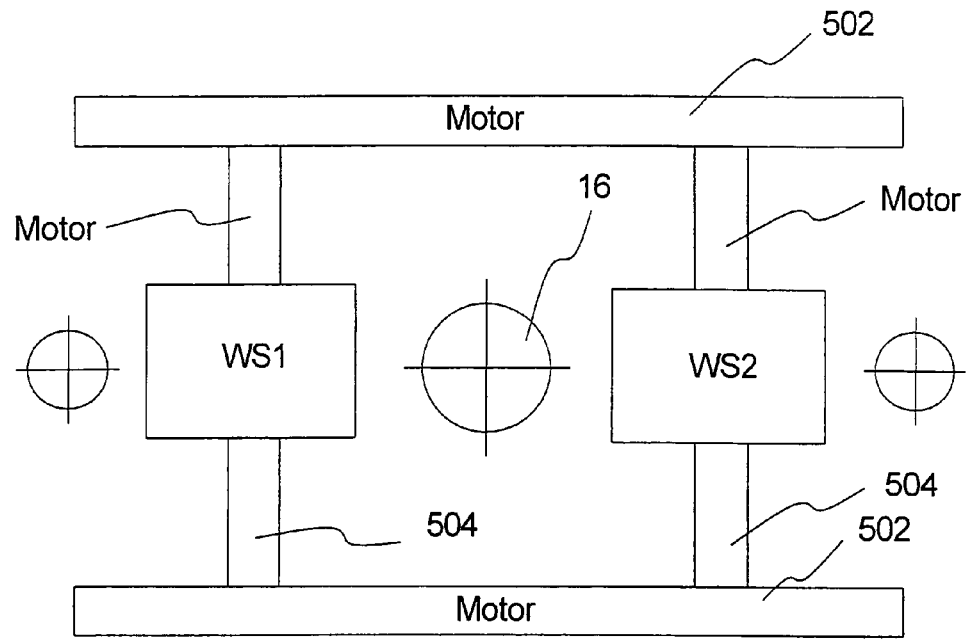
FIGS. 5A and 5B are top down views of two different twin wafer stages according to other embodiments of the invention.
Figure 5B:
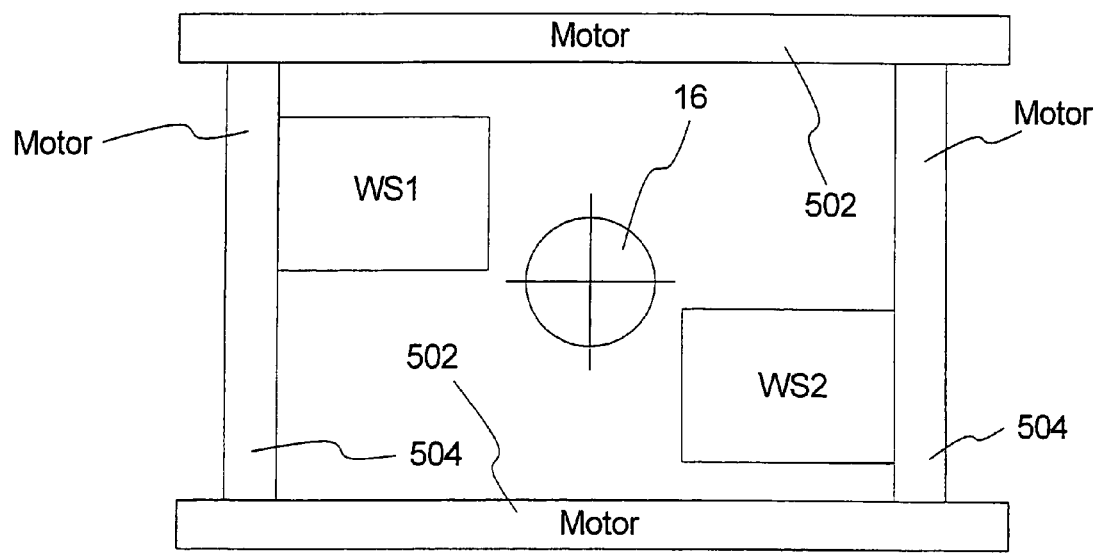

FIGS. 5A and 5B are top down views of two different twin stage immersion lithography systems according to other embodiments of the present invention. For the basic structure and operation of the twin stage lithography systems, see U.S. Pat. Nos. 6,262,796 and 6,341,007. The disclosures of U.S. Pat. Nos. 6,262,796 and 6,341,007 are incorporated herein by reference in their entireties. In both embodiments, a pair of wafer stages WS1 and WS2 are shown. Motors 502 are used to move or position the two stages WS1 and WS2 in the horizontal direction (in the drawings), whereas motors 504 are used to move or position the stages WS1 and WS2 in the vertical direction (in the drawings). The motors 502 and 504 are used to alternatively position one stage under the optical assembly 16 while a wafer exchange and alignment is performed on the other stage. When the exposure of the wafer under the optical assembly 16 is complete, then the two stages are swapped and the above process is repeated. With either configuration, the various embodiments of the invention for maintaining immersion fluid in the gap under the optical assembly 16 as described and illustrated above with regard to FIGS. 2 through 4, can be used with either twin stage arrangement. With regard the embodiment of FIG. 2 for example, each wafer stage SW1 and SW2 of either FIG. 5A or 5B can be modified to include a pad 222 and a support member 224. With regard to the embodiment of FIG. 3, a single pad 326, motor 328, and control system 330 could be used adjacent to the optical assembly 16. The pad 326 is movable separately from the stages SW1 and SW2. During the time when stages SW1 and SW2 are to be swapped, the pad 326 is moved to under the optical assembly 16 to maintain the immersion fluid 312 below the optical assembly 16. Finally with the embodiment of FIG. 4, a detachable single pad can be used. During the time when stages SW1 and SW2 are to be swapped, the pad 426 is used to maintain the immersion fluid in the gap as illustrated in FIG. 4B. On the other hand during exposure, the pad is clamped onto the wafer table on the wafer stage that is being exposed. In this manner, only a single pad is needed for the two stages WS1 and WS2. Alternatively, as described below, the second stage can also be used as the pad.

Figure 6A:
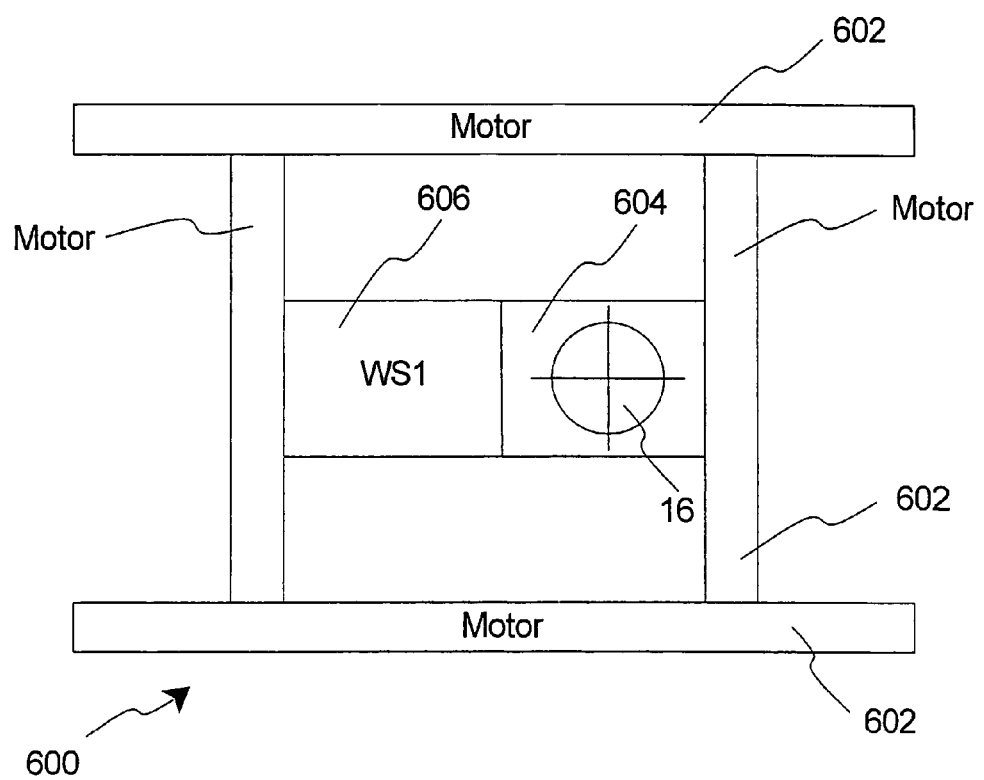
FIG. 6A is a top down view of a twin stage lithography machine according to another embodiment of the invention.

Referring to FIG. 6A, a top down view of a twin stage lithography machine illustrating one embodiment of practicing the invention is shown. In this embodiment, the immersion lithography system 600 includes first stage 604 and second stage 606. The two stages are moved in the X and Y directions by motors 602. In this embodiment, the stages 604 and 606 themselves are used to contain the immersion fluid in the gap. For example as shown in the Figure, the first stage 604 is positioned under the optical assembly 16. When it is time for the work piece to be exchanged, the motors 602 are used to position the second stage 606 with a second work piece adjacent to the first stage 604. With the two stages positioned side-by-side, they substantially form a continuous surface. The motors 602 are then used to move the two stages in unison so that the second stage 604 is position under the optical assembly 16 and the first stage is no longer under the optical assembly 16. Thus when the first work piece is moved away from the optical assembly 16, the immersion fluid in the gap is maintained by the second stage 606, which forms the substantially continuous surface with the first stage. In various alternative embodiments, the second stage 606 could also be a "pad" stage that contains a pad that is used to maintain the immersion liquid in the gap while a second work piece is being placed onto the first stage 604. Similarly, the motor arrangement shown in either FIG. 5A or 5B could be used.

Figure 6B:
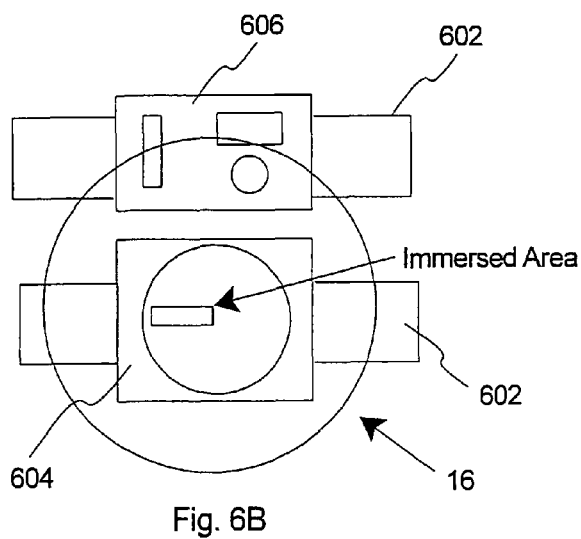
FIGS. 6B-6E are a series of diagrams illustrating a wafer exchange according to the invention.
Figure 6C:
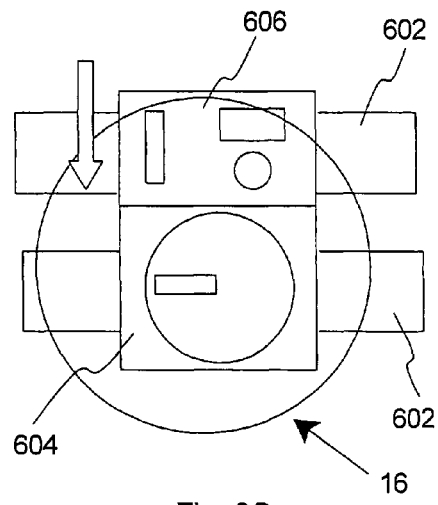
Figure 6D:
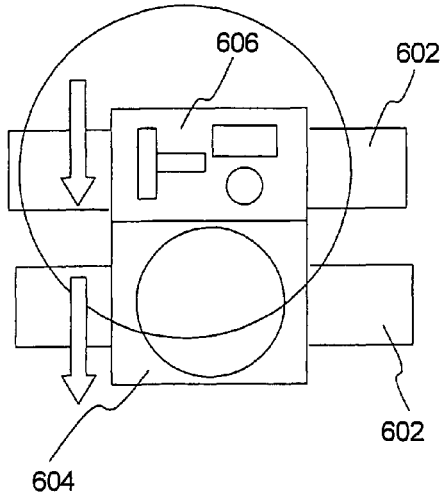
Figure 6E:
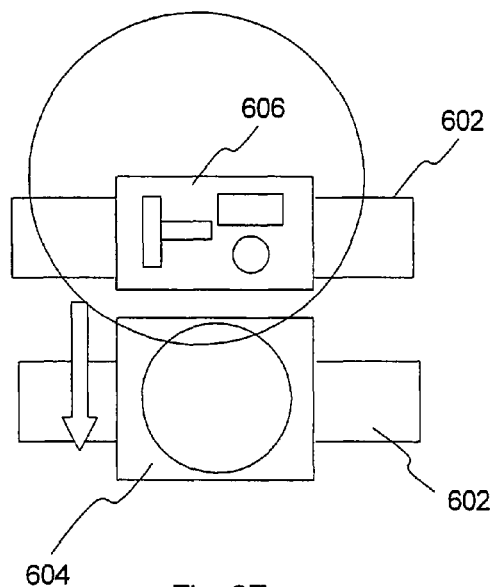

Referring to FIGS. 6B-6E, a series of diagrams illustrating a work piece exchange according to one embodiment of the invention is illustrated. FIG. 6B shows a wafer on stage 604 after exposure is completed. FIG. 6C shows the second stage 606 in contact (or immediately adjacent) with the first stage 604 under the optical assembly 16. FIG. 6C shows a transfer taking place, i.e., the second stage 606 is positioned under the optical assembly 16. Finally, in FIG. 6E, the first stage 604 is moved away from the optical assembly 16. As best illustrated in FIGS. 6C and 6D, the two stages 604 and 606 provide a continuous surface under the optical assembly 16 during a transfer, thus maintaining the immersion fluid in the gap. In the embodiment shown, the second stage 606 is a pad stage. This stage, however, could also be a work piece stage as noted above.

In the various embodiments described above, the pad can be made of a number of different materials, such as ceramic, metal, plastic. These materials may also be coated with Teflon according to other embodiments. The size of the pad also should be sufficient to cover the area occupied by the immersion fluid. In the various embodiments described above, the surface of the last optical element of the optical assembly 16 is constantly under immersion fluid environment, preventing the formation of a fluid mark (e.g. "a water mark").

Figure 7A:
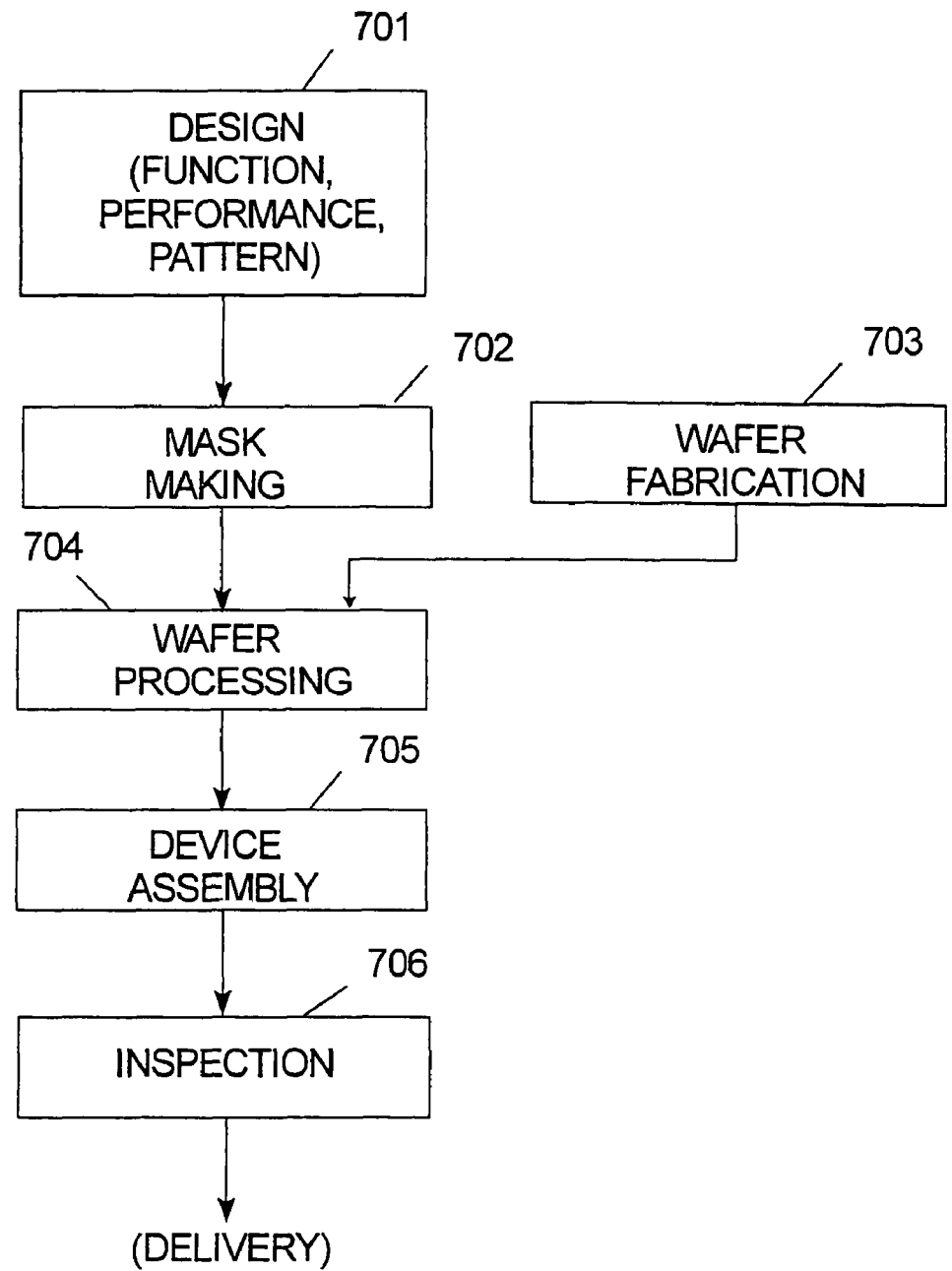
FIG. 7A is a flow chart that outlines a process for manufacturing a work piece in accordance with the invention.

Semiconductor wafers can be fabricated using the above described systems, by the process shown generally in FIG. 7A. In step 701 the work piece's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the invention. In step 705 the semiconductor work piece is assembled (including the dicing process, bonding process and packaging process); finally, the work piece is then inspected in step 706.

Figure 7B:
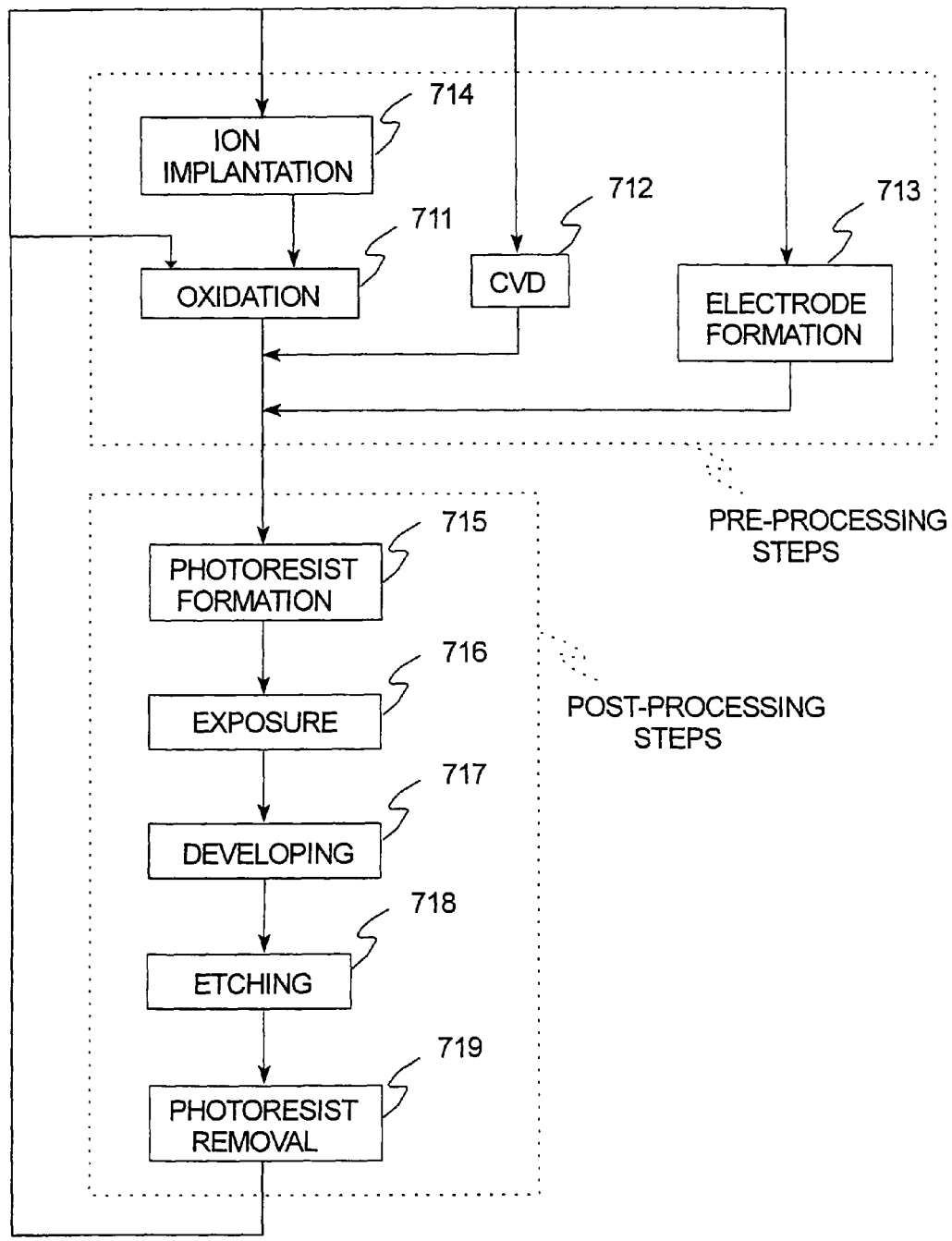
FIG. 7B is a flow chart that outlines work piece processing in more detail.

FIG. 7B illustrates a detailed flowchart example of the above-mentioned step 704 in the case of fabricating semiconductor work pieces. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion-implantation step), ions are implanted in the wafer. The above mentioned steps 711-714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure work piece is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

While the particular lithography machines as shown and disclosed herein are fully capable of obtaining the objects and providing the advantages herein before stated, it is to be understood that they are merely illustrative embodiments of the invention, and that the invention is not limited to these embodiments.

What is claimed is:

1. A liquid immersion exposure apparatus in which a substrate is exposed to an exposure beam through an immersion liquid, the apparatus comprising:
   an optical member through which the substrate is exposed to the exposure beam;
   a cover member having a surface;
   a first holding system that detachably holds the cover member;

a second holding system that holds the cover member which has been released from the first holding system, wherein the surface of the cover member is disposed opposite to the optical member while the cover member is held by the second holding system; and a stage assembly which is movable relative to the optical member, wherein the first holding system holds the cover member on the stage assembly.

2. The liquid immersion exposure apparatus according to claim 1, wherein the first holding system includes a vacuum holding system.

3. The liquid immersion exposure apparatus according to claim 2, wherein the second holding system includes a vacuum holding system.

4. The liquid immersion exposure apparatus according to claim 1, wherein the stage assembly includes a substrate table on which the substrate is retained.

5. The liquid immersion exposure apparatus according to claim 4, wherein the first holding system holds the cover member on the substrate table.

6. The liquid immersion exposure apparatus according to claim 4, wherein the first holding system holds the cover member when the substrate table is under the optical member.

7. The liquid immersion exposure apparatus according to claim 4, wherein the first holding system holds the cover member when the substrate is exposed.

8. The liquid immersion exposure apparatus according to claim 4, wherein the substrate table is movable relative to the second holding system.

9. The liquid immersion exposure apparatus according to claim 8, wherein the substrate table is moved away from the optical member when the cover member is held by the second holding system.

10. The liquid immersion exposure apparatus according to claim 9, wherein a substrate exchange operation of the substrate on the substrate table is performed, while the second holding system holds the cover member.

11. The liquid immersion exposure apparatus according to claim 4, wherein a gap between the optical member and the cover member is filled with the immersion liquid while the second holding system holds the cover member.

12. The liquid immersion exposure apparatus according to claim 11, wherein during a transition from a first state in which the cover member is held by one of the first and second holding systems to a second state in which the cover member is held by the other of the first and second holding systems, the optical member is kept in contact with the immersion liquid.

13. The liquid immersion exposure apparatus according to claim 1, wherein the stage assembly is movable relative to the second holding system.

14. The liquid immersion exposure apparatus according to claim 1, wherein a gap between the optical member and the cover member is filled with the immersion liquid while the second holding system holds the cover member.

15. The liquid immersion exposure apparatus according to claim 14, wherein during a transition from a first state in which the cover member is held by one of the first and second holding systems to a second state in which the cover member is held by the other of the first and second holding systems, the optical member is kept in contact with the immersion liquid.

16. The liquid immersion exposure apparatus according to claim 1, wherein the second holding system includes a vacuum holding system.

17. The liquid immersion exposure apparatus according to claim 1, wherein the surface of the cover member is attracted to the second holding system.

18. The liquid immersion exposure apparatus according to claim 1, wherein the substrate includes a wafer which is exposed to the exposure beam through optical member and the immersion liquid fills a gap between the wafer and the optical member.

19. The liquid immersion exposure apparatus according to claim 1, further comprising a liquid system that supplies the immersion liquid.

20. The liquid immersion exposure apparatus according to claim 19, wherein the liquid system also recovers the immersion liquid.

21. A liquid immersion exposure method in which a substrate is exposed to an exposure beam through an immersion liquid, the method comprising:

providing the substrate opposite to an optical member through which the substrate is exposed to the exposure beam;

releasing a cover member from a first holding system; and holding the cover member released from the first holding system by a second holding system so that the cover member is opposite to the optical member, wherein the first holding system holds the cover member on a stage assembly which is movable relative to the optical member.

22. The liquid immersion exposure method according to claim 21, wherein the first holding system includes a vacuum holding system.

23. The liquid immersion exposure method according to claim 22, wherein the second holding system includes a vacuum holding system.

24. The liquid immersion exposure method according to claim 21, wherein the second holding system includes a vacuum holding system.

25. The liquid immersion exposure method according to claim 21, wherein the stage assembly includes a substrate table on which the substrate is retained.

26. The liquid immersion exposure method according to claim 25, wherein the first holding system holds the cover member on the substrate table.

27. The liquid immersion exposure method according to claim 25, wherein the first holding system holds the cover member when the substrate table is under the optical member.

28. The liquid immersion exposure method according to claim 27, wherein the first holding system holds the cover member when the substrate is exposed.

29. The liquid immersion exposure method according to claim 25, wherein the stage assembly is movable relative to the second holding system.

30. The liquid immersion exposure method according to claim 29, further comprising moving the substrate table away from the optical member when the second holding system holds the cover member opposite to the optical member.

31. The liquid immersion exposure method according to claim 30, further comprising performing a substrate exchange operation of the substrate on the substrate table, while the second holding system holds the cover member opposite to the optical member.

32. The liquid immersion exposure method according to claim 25, wherein a gap between the optical member and the cover member is filled with the immersion liquid while the second holding system holds the cover member.

33. The liquid immersion exposure method according to claim 32, wherein during a transition from a first state in which the cover member is held by the first holding system to a second state in which the cover member is held by the second holding system opposite to the optical member, the optical member is kept in contact with the immersion liquid.

34. The liquid immersion exposure method according to claim 21, wherein a gap between the optical member and the cover member is filled with the immersion liquid while the second holding system holds the cover member.

35. The liquid immersion exposure method according to claim 34, wherein during a transition from a first state in which the cover member is held by the first holding system to a second state in which the cover member is held by the second holding system opposite to the optical member, the optical member is kept in contact with the immersion liquid.

36. The liquid immersion exposure method according to claim 21, wherein the substrate includes a wafer which is exposed to the exposure beam through optical member and the immersion liquid fills a gap between the wafer and the optical member.

37. A device manufacturing method comprising:
providing a substrate opposite to an optical member of an immersion exposure apparatus through which the substrate is exposed to an exposure beam through an immersion liquid;
releasing a cover member from a first holding system; and
holding the cover member released from the first holding system by a second holding system so that the cover member is opposite to the optical member,
wherein the first holding system holds the cover member on a stage assembly which is movable relative to the optical member.

38. The device manufacturing method according to claim 37, wherein the first holding system includes a vacuum holding system.

39. The device manufacturing method according to claim 38, wherein the second holding system includes a vacuum holding system.

40. The device manufacturing method according to claim 37, wherein the second holding system includes a vacuum holding system.

41. The device manufacturing method according to claim 37, wherein the stage assembly includes a substrate table on which the substrate is retained, and the first holding system holds the cover member on the substrate table.

42. The device manufacturing method according to claim 41, wherein the stage assembly is movable relative to the second holding system, and the substrate table is moved away from the optical member when the second holding system holds the cover member opposite to the optical member.

43. The device manufacturing method according to claim 37, wherein a gap between the optical member and the cover member is filled with the immersion liquid while the second holding system holds the cover member.

44. The device manufacturing method according to claim 43, wherein during a transition from a first state in which the cover member is held by the first holding system to a second state in which the cover member is held by the second holding system opposite to the optical member, the optical member is kept in contact with the immersion liquid.

45. The device manufacturing method according to claim 37, wherein the substrate includes a wafer which is exposed to the exposure beam through optical member and the immersion liquid fills a gap between the wafer and the optical member.

* * * * *

UNITED STATES PATENT AND TRADEMARK OFFICE
CERTIFICATE OF CORRECTION

| | | |
|---|---|---|
| PATENT NO. | : 8,269,944 B2 | |
| APPLICATION NO. | : 11/882837 | |
| DATED | : September 18, 2012 | |
| INVENTOR(S) | : Michael Binnard | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 0 days.
This patent is subject to a terminal disclaimer.

Signed and Sealed this
Twenty-ninth Day of January, 2013

David J. Kappos
*Director of the United States Patent and Trademark Office*